(12) United States Patent
Sawada

(10) Patent No.: US 9,060,461 B2
(45) Date of Patent: Jun. 16, 2015

(54) LAMINATED CERAMIC ELECTRONIC COMPONENT, MANUFACTURING METHOD THEREFOR, SERIAL TAPING ELECTRONIC COMPONENT, MANUFACTURING METHOD THEREFOR, AND DIRECTION IDENTIFICATION METHOD FOR LAMINATED CERAMIC ELECTRONIC COMPONENT

(71) Applicant: Murata Manufacturing Co., Ltd., Nagaokakyo-shi, Kyoto-fu (JP)

(72) Inventor: Takashi Sawada, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 50 days.

(21) Appl. No.: 14/063,077

(22) Filed: Oct. 25, 2013

(65) Prior Publication Data
US 2014/0126106 A1 May 8, 2014

(30) Foreign Application Priority Data
Nov. 5, 2012 (JP) ................................. 2012-243384

(51) Int. Cl.
| | | |
|---|---|---|
| H01G 4/005 | (2006.01) | |
| H05K 13/00 | (2006.01) | |
| H01G 4/30 | (2006.01) | |
| H01G 2/06 | (2006.01) | |
| H01G 4/232 | (2006.01) | |

(52) U.S. Cl.
CPC ............ *H05K 13/0084* (2013.01); *Y10T 29/43* (2015.01); *H01G 4/30* (2013.01); *H01G 2/06* (2013.01); *H01G 4/232* (2013.01)

(58) Field of Classification Search
USPC ........ 361/303, 304–305, 301.1, 301.2, 301.4, 361/306.1, 306.3, 311–313, 321.1, 321.2
See application file for complete search history.

(56) References Cited

U.S. PATENT DOCUMENTS 6,388,864 B1 * 5/2002 Nakagawa et al. ........... 361/309
6,445,593 B1    9/2002 Okuyama
(Continued)

FOREIGN PATENT DOCUMENTS

JP  2001-057311 A  2/2001
JP  2001-167989 A  6/2001
(Continued)

*Primary Examiner* — Nguyen T Ha
(74) *Attorney, Agent, or Firm* — Keating & Bennett, LLP

(57) ABSTRACT

In a laminated ceramic electronic component, a side surface outer electrode circles around a ceramic element body, a first electrode portion includes a first side surface electrode portion on first and second side surfaces of the ceramic element body and a first wrap-around electrode portion extending from the first side surface electrode portion and wraps around portions of third and fourth side surfaces, and a second electrode portion includes a second side surface electrode portion on the third and fourth side surfaces and a second wrap-around electrode portion extending from the second side surface electrode portion and wrap around portions of the first and second side surfaces. External appearance configurations in which the first and second wrap-around electrode portions are recognizable from outside are provided to the first and second wrap-around electrode portions.

24 Claims, 11 Drawing Sheets

(56) References Cited

U.S. PATENT DOCUMENTS

| | | | |
|---|---|---|---|
| 6,547,879 B1 | 4/2003 | Chiba et al. | |
| 7,362,559 B2 * | 4/2008 | Tominaga | 361/306.1 |
| 7,715,172 B2 * | 5/2010 | Kawasaki et al. | 361/303 |
| 7,808,770 B2 * | 10/2010 | Itamura et al. | 361/309 |
| 8,254,081 B2 * | 8/2012 | Nishihara et al. | 361/300 |
| 8,553,390 B2 * | 10/2013 | Taniguchi et al. | 361/321.1 |
| 2005/0167243 A1 | 8/2005 | Yagi | |
| 2011/0205684 A1 | 8/2011 | Yamamoto et al. | |

FOREIGN PATENT DOCUMENTS

| | | |
|---|---|---|
| JP | 2002-184648 A | 6/2002 |
| JP | 2005-217136 A | 8/2005 |
| JP | 2006-100708 A | 4/2006 |
| JP | 3430854 B2 | 7/2008 |
| JP | 2009-239094 A | 10/2009 |
| JP | 2011-192968 A | 9/2011 |
| JP | 2012-028502 A | 2/2012 |

* cited by examiner

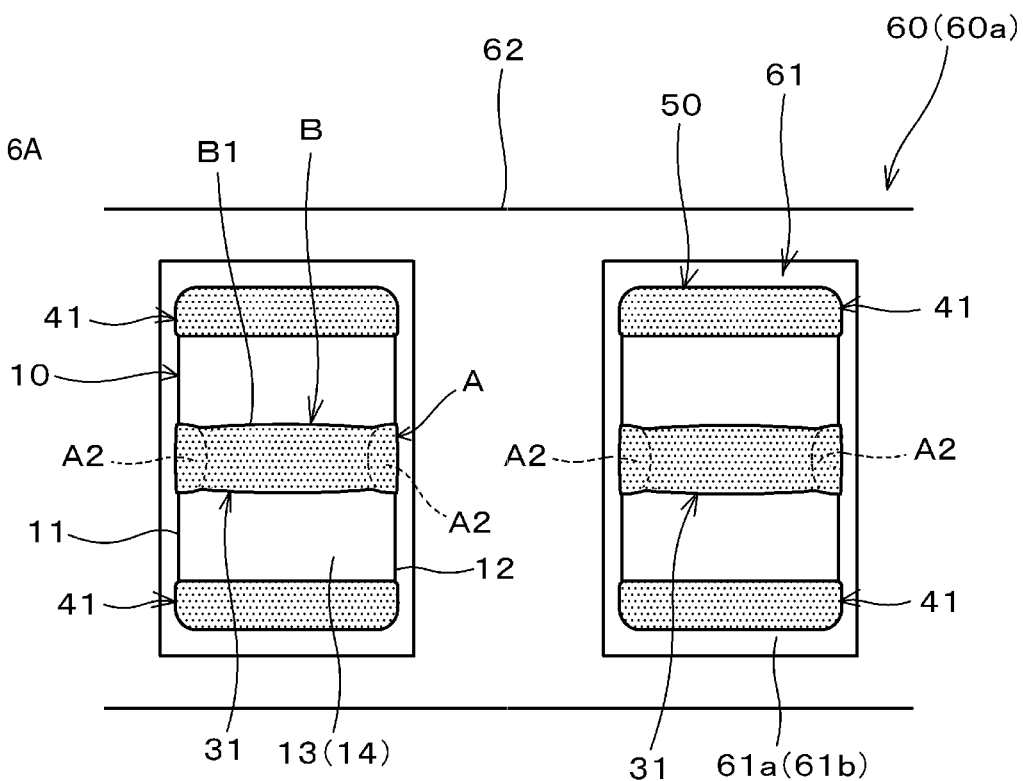
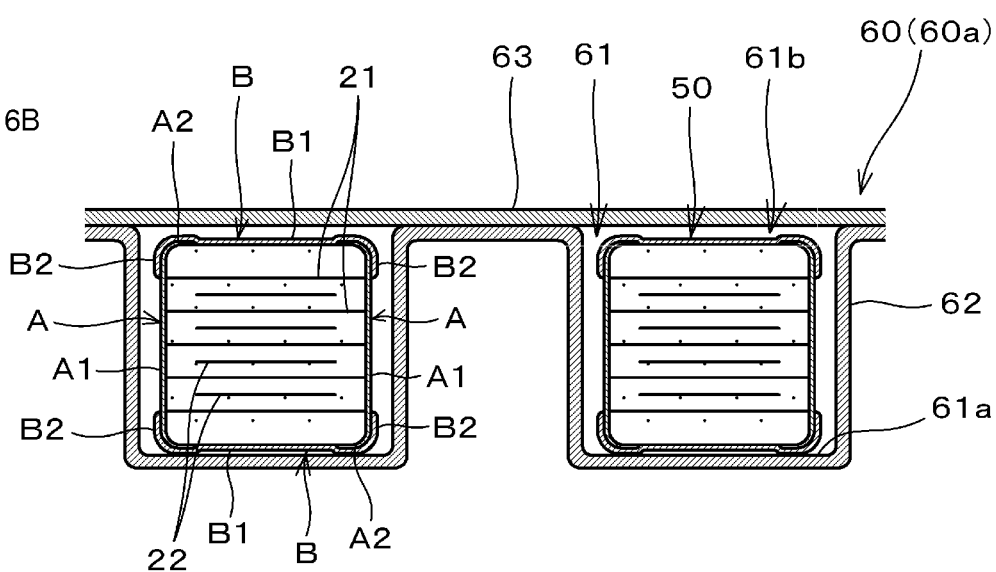

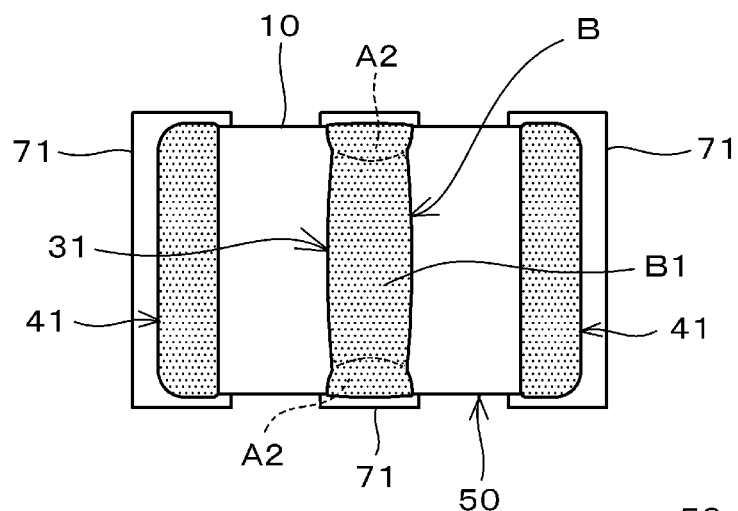
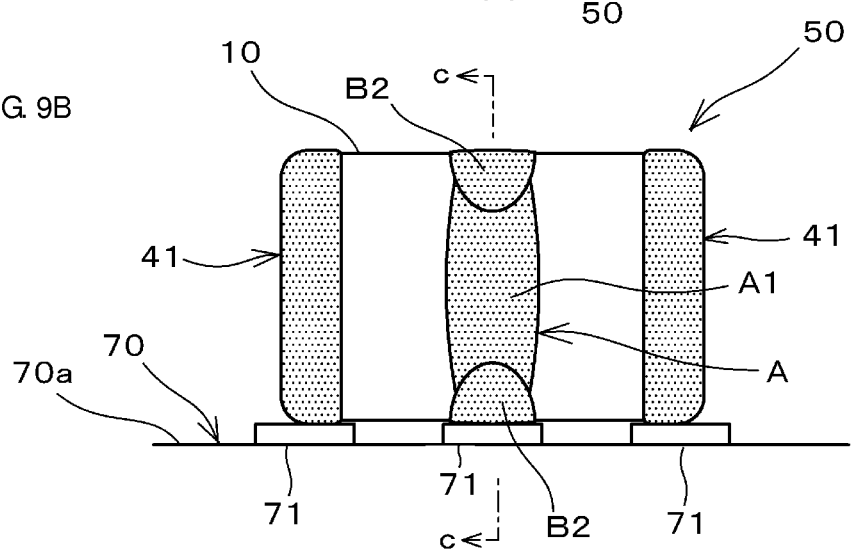
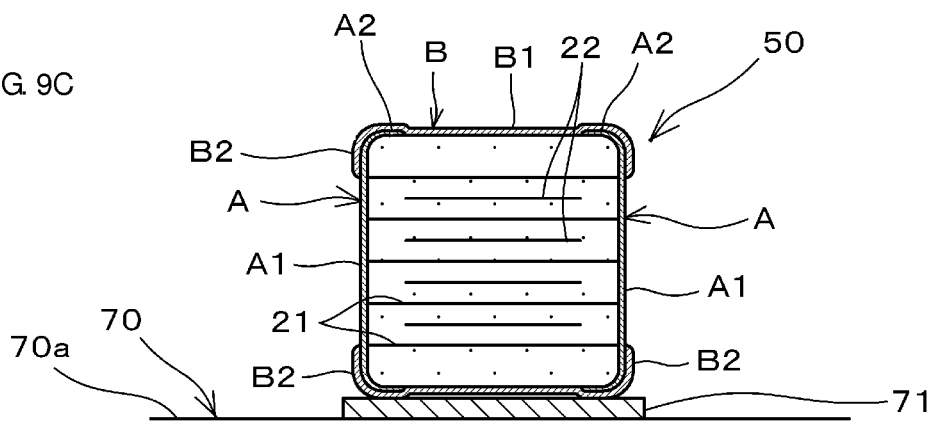

LAMINATED CERAMIC ELECTRONIC COMPONENT, MANUFACTURING METHOD THEREFOR, SERIAL TAPING ELECTRONIC COMPONENT, MANUFACTURING METHOD THEREFOR, AND DIRECTION IDENTIFICATION METHOD FOR LAMINATED CERAMIC ELECTRONIC COMPONENT

BACKGROUND OF THE INVENTION

1. Field of the Invention

The present invention relates to a laminated ceramic electronic component, a manufacturing method therefor, a serial taping electronic component, a manufacturing method therefor, and a direction identification method for a laminated ceramic electronic component.

2. Description of the Related Art

As one of typical laminated ceramic electronic components, there is a laminated ceramic capacitor. In addition, to adopt a substantially quadrangular prism structure where a thickness (a dimension in a lamination direction) T and a width W are caused to be approximately equal to each other is effective for dealing with downsizing and capacity enlargement at the same time in such a laminated ceramic capacitor.

In addition, as the laminated ceramic capacitor, for example, as illustrated in FIG. 11, a substantially chip-shaped three-terminal type laminated ceramic capacitor has been known that has a structure in which a pair of end portion-side outer electrodes (for example, signal terminal electrodes) 102a and 102b and a substantially belt-like side surface outer electrode (for example, a ground terminal electrode) 103 circling around a capacitor main body (ceramic element body) 101 are included in the outer surface of the ceramic element body 101 (see, for example, Japanese Unexamined Patent Application Publication No. 2001-57311).

Incidentally, when the laminated ceramic capacitor is mounted on a mounting target such as a circuit substrate, in some cases it is preferable that the laminated ceramic capacitor is mounted with adjusting the direction of an internal electrode (for example, whether the direction of the main surface of the internal electrode is approximately vertical or parallel to a mounting surface) or the direction of the internal electrode in a mounted state is recognizable.

However, when the substantially quadrangular prism structure is adopted, it becomes difficult to identify the direction of the internal electrode by observing the shape thereof from the outside. In addition, in the same way, in the case of the above-mentioned three-terminal type laminated ceramic capacitor in FIG. 11, which includes the substantially belt-like side surface outer electrode circling around, it is also difficult to identify the direction of the internal electrode by observation from the outside.

Therefore, a technique has been developed that does not identify the direction of an internal electrode by observation from the outside but adjusts the direction of a laminated ceramic capacitor by a magnetic force (see, for example, Japanese Unexamined Patent Application Publication No. 2005-217136 or Japanese Patent No. 3430854).

However, the technique disclosed in Japanese Unexamined Patent Application Publication No. 2005-217136 or Japanese Patent No. 3430854 is based on the assumption of being used in a laminated ceramic capacitor having a typical 2-terminal structure, and when the technique is applied to the laminated ceramic capacitor including the substantially belt-like side surface outer electrode 103 circling around the side surface of the ceramic element body 101, as illustrated in FIG. 11, it appears to be a reality that it is difficult to adjust the direction of a laminated ceramic capacitor with accuracy.

In other words, as described in paragraphs [0008] to [0010] in Japanese Patent No. 3430854, directional alignment due to a magnetic force is performed due to a difference in a magnetic flux density when magnetic force lines generated by a magnet pass through an internal electrode including a magnetic substance (Ni or the like). However, in the case of the laminated ceramic capacitor including the substantially belt-like side surface outer electrode circling around the side surface of the ceramic element body, since usually the plating of Ni is performed on a side surface outer electrode, the magnetic substance turns out to circle around the side surface of the ceramic element body. Therefore, a difference in a magnetic flux density, due to the direction of the internal electrode, becomes small, and the accuracy of the directional alignment due to the magnetic force turns out to be reduced.

SUMMARY OF THE INVENTION

Accordingly, preferred embodiments of the present invention provide a laminated ceramic electronic component including a belt-shaped or substantially belt-shaped outer electrode arranged so as to circle around a side surface of a ceramic element body, the laminated ceramic electronic component being capable of identifying a direction of an internal electrode, a manufacturing method therefor, a serial taping electronic component in which laminated ceramic electronic components according to preferred embodiments of the present invention are housed in cavities of a carrier tape, a manufacturing method therefor, and a direction identification method for a laminated ceramic electronic component, the direction identification method being capable of identifying the direction of the laminated ceramic electronic component by external observation.

According to a preferred embodiment of the present invention, a laminated ceramic electronic component includes a ceramic element body with a prism-shaped or substantially prism-shaped structure and including a plurality of laminated ceramic layers, first and second end surfaces facing each other, first and second side surfaces and third and fourth side surfaces, which link the first and second end surfaces with each other and face each other, the end surfaces having square or substantially square shapes, a plurality of internal electrodes provided within the ceramic element body and extending to the first and second side surfaces, and a belt-shaped or substantially belt-shaped side surface outer electrode arranged in the first to fourth side surfaces of the ceramic element body so as to circle around the ceramic element body and connected to the internal electrodes extended to the first and second side surfaces, wherein the side surface outer electrode circling around the ceramic element body includes a first electrode portion including a first side surface electrode portion provided on the first and second side surfaces of the ceramic element body and a first wrap-around electrode portion arranged to extend from the first side surface electrode portion and wrap around portions of the third and fourth side surfaces, and a second electrode portion including a second side surface electrode portion provided on the third and fourth side surfaces and a second wrap-around electrode portion arranged to extend from the second side surface electrode portion and wrap around portions of the first and second side surfaces, and external appearance configurations in which the first wrap-around electrode portion and the second wrap-around electrode portion are recognizable from the outside are provided to the first wrap-around electrode portion and the second wrap-around electrode portion.

In addition, in various preferred embodiments of the present invention, that "external appearance configurations in which the first wrap-around electrode portion and the second wrap-around electrode portion are recognizable from the outside are provided to" the first wrap-around electrode portion and the second wrap-around electrode portion is a wide-ranging concept examples of which includes:

(a) to cause the first and second wrap-around electrode portions to have different shapes, specifically, to cause one of the both thereof to have a rounded or substantially rounded shape and to cause the other to have an angular or substantially angular shape or to cause one of the both thereof to be bent in a predetermined direction and to cause the other to be bent in an opposite direction;

(b) to cause the wrap-around lengths of the first and second wrap-around electrode portions to be different from each other;

(c) to cause one of the first and second wrap-around electrode portions to be certainly located on a lower layer side and to cause the other to be certainly located on an upper layer side; and (d) to combine two or more of the above-mentioned examples (a), (b), and (c).

In addition, in preferred embodiments of the present invention, that "the end surfaces of the ceramic element body have square or substantially square shapes" means that when a distance (length) connecting the first and second end surfaces is defined as L, the direction thereof is defined as an L direction, a distance (width) connecting the first and second side surfaces is defined as W, the direction thereof is defined as a W direction, a distance (thickness) connecting the third and fourth side surfaces is defined as T, and the direction thereof is defined as a T direction, lengths in the W direction and the L direction (namely, the width W and the thickness T) are equal or approximately equal to each other. Here, that the lengths in the W direction and the L direction are equal or approximately equal to each other indicates a size for which direction identification is difficult, and indicates a case where the length of the other falls within about 75 to 100 when the length of one of the W and T is set to about 100, in the narrow meaning, a case where the length of the other falls within about 85 to 100 when the length of one of the W and T is set to about 100, for example.

In addition, in the laminated ceramic electronic component according to various preferred embodiments of the present invention, it is preferable that whether the first wrap-around electrode portion in the first electrode portion is arranged so as to be located in an outer side portion of the second electrode portion or the second wrap-around electrode portion in the second electrode portion is arranged so as to be located in an outer side portion of the first electrode portion is preliminarily set, and it is preferable that the first and second side surfaces of the ceramic element body, to which the internal electrodes are extended, are recognizable by observing, from the outside, which of the first and second wrap-around electrode portions is located in the outer side portion.

The above-mentioned configuration is included, and hence, by observing which of the first and second wrap-around electrode portions is located in the outer side portion, it is possible to recognize the first and second side surfaces of the ceramic element body, to which the internal electrodes are extended. As a result, it is possible to recognize, for example, the extraction directions of the internal electrodes or whether the directions of the main surfaces of the internal electrodes are parallel or approximately parallel or vertical or approximately vertical, and it is possible to cause preferred embodiments of the present invention to be more effective.

In addition, since it is only necessary to identify which of the first and second wrap-around electrode portions is located in the outer side portion, it becomes easy to observe from the outside.

It is preferable that the second wrap-around electrode portion in the second electrode portion is arranged so as to be located in an outer side portion of the first electrode portion, and it is preferable that the first and second side surfaces, to which the internal electrodes are extended, are recognizable by recognizing a side surface, in which the second wrap-around electrode portion wraps around the outer side portion of the first electrode portion, by external observation.

The above-mentioned configuration is included, and hence, by observing, from the outside, a side surface, in which the second wrap-around electrode portion wraps around the outer side portion of the first electrode portion and is located on the outer side portion of the first electrode portion, it is possible to recognize that the side surfaces, in which the second wrap-around electrode portion wraps around the outer side portion of the first electrode portion, are the first and second side surfaces, to which the internal electrodes are extended, and it is possible to cause preferred embodiments of the present invention to be more effective.

It is preferable that the first wrap-around electrode portion in the first electrode portion is arranged so as to be located in an outer side portion of the second electrode portion, and it is preferable that the first and second side surfaces, to which the internal electrodes are extended, are recognizable by recognizing a side surface around which the first wrap-around electrode portion wraps, by external observation.

The above-mentioned configuration is included, and hence, it is possible to reliably recognize, from the outside, that side surfaces in which the first wrap-around electrode portion wraps around the outer side portion of the second electrode portion and is located on the outer side portion of the second electrode portion are the third and fourth side surfaces to which no internal electrode is extended and side surfaces in which the first wrap-around electrode portion does not wrap around the outer side portion of the second electrode portion are the first and second side surfaces to which the internal electrodes are extended.

In a laminated ceramic electronic component according to a preferred embodiment of the present invention, it is preferable that a distance of the first wrap-around electrode portion in the first electrode portion, which leads from the first side surface or the second side surface of the ceramic element body to a leading end thereof, is larger than a distance of the second wrap-around electrode portion in the second electrode portion, which extends from the third side surface or the fourth side surface of the ceramic element body to a leading end thereof, and it is preferable that, by observing the wrap-around electrode portion from the outside and recognizing that a wrap-around electrode portion where a distance from a side surface of the ceramic element body to a leading end is larger is the first wrap-around electrode portion in the first electrode portion, the first and second side surfaces, to which the internal electrodes are extended, are recognizable from a surface in which the first wrap-around electrode portion is located.

When the above-mentioned configuration is adopted, it is possible to recognize, for example, the extraction directions of the internal electrodes or whether the directions of the main surfaces of the internal electrodes are parallel or approximately parallel or vertical or approximately vertical, by observing the wrap-around electrode portion from the outside, and it is possible to cause preferred embodiments of the present invention to be more effective.

In addition, it is preferable that a distance of the second wrap-around electrode portion in the second electrode portion, which extends from the third side surface or the fourth side surface of the ceramic element body to a leading end thereof is larger than a distance of the first wrap-around electrode portion in the first electrode portion, which extends from the first side surface or the second side surface of the ceramic element body to a leading end thereof, and it is preferable that, by observing the wrap-around electrode portion from the outside and recognizing that a wrap-around electrode portion where a distance from a side surface of the ceramic element body to a leading end is larger is the second wrap-around electrode portion in the second electrode portion, the first and second side surfaces, to which the internal electrodes are extended, are recognizable from a surface in which the second wrap-around electrode portion is located.

When the above-mentioned configuration is adopted, it is possible to recognize, for example, the extraction directions of the internal electrodes or whether the directions of the main surfaces of the internal electrodes are parallel or approximately parallel or vertical or approximately vertical, by observing the wrap-around electrode portion from the outside, and it is possible to cause preferred embodiments of the present invention to be more effective.

In addition, in a manufacturing method for a laminated ceramic electronic component according to another preferred embodiment of the present invention, the laminated ceramic electronic component including a ceramic element body having a prism-shaped or substantially prism-shaped structure and including a plurality of laminated ceramic layers, first and second end surfaces facing each other, first and second side surfaces and third and fourth side surfaces, which link the first and second end surfaces with each other and face each other, the end surfaces having square or substantially square shapes, a plurality of internal electrodes configured to be provided within the ceramic element body and extended to the first and second side surfaces, and a belt-shaped or substantially belt-shaped side surface outer electrode arranged on the first to fourth side surfaces of the ceramic element body so as to circle around the ceramic element body and connected to the internal electrodes extended to the first and second side surfaces, a process for forming the side surface outer electrode includes a first application process in which a conductive paste is applied to the first and second side surfaces so that the conductive paste extends from the first and second side surfaces and wraps around the third and fourth side surfaces and a first wrap-around electrode portion for the third and fourth side surfaces is formed, and a second application process in which a conductive paste is applied to the third and fourth side surfaces so that the conductive paste extends from the third and fourth side surfaces and wraps around the first and second side surfaces and a second wrap-around electrode portion for the first and second side surfaces is formed, wherein external appearance configurations where the first wrap-around electrode portion and the second wrap-around electrode portion are recognizable by external observation are provided to the first wrap-around electrode portion and the second wrap-around electrode portion.

In addition, in the manufacturing method for a laminated ceramic electronic component according to a preferred embodiment of the present invention, it is preferable that which of the first application process and the second application process is implemented first is preliminarily set and the first application process and the second application process are implemented in a set sequence.

The above-mentioned configuration is included, and hence, it is possible to reliably recognize the first and second side surfaces of the ceramic element body, to which the internal electrodes are extended, by observing, from the outside, which of the first and second wrap-around electrode portions is located in the outer side portion, and it is possible to cause preferred embodiments of the present invention to be more effective.

In addition, it is preferable that the second application process is implemented after the first application process has been implemented.

The above-mentioned configuration is included, and hence, by observing, from the outside, a side surface, around which the second wrap-around electrode portion wraps to be located on the outer side portion of the first electrode portion, it is possible to easily and reliably recognize that the side surfaces around which the second wrap-around electrode portion wraps are the first and second side surfaces, to which the internal electrodes are extended, and it is possible to cause preferred embodiments of the present invention to be more effective.

In addition, it is preferable that the first application process is implemented after the second application process has been implemented.

The above-mentioned configuration is included, and hence, by observing, from the outside, the side surface around which the first wrap-around electrode portion wraps, it is possible to easily and reliably recognize that side surfaces around which the first wrap-around electrode portion wraps to be located on the outer side portion of the second electrode portion are side surfaces (the third and fourth side surfaces) to which no internal electrode is extended and side surfaces around which the first wrap-around electrode portion does not wrap are the first and second side surfaces to which the internal electrodes are extended.

In addition, a serial taping electronic component according to a preferred embodiment of the present invention includes a carrier tape configured to include a plurality of cavities, and a laminated ceramic electronic component configured to be housed in each of the cavities, wherein the laminated ceramic electronic component is the laminated ceramic electronic component according to any one of the preferred embodiments of the present invention.

In addition, in the serial taping electronic component according to a preferred embodiment of the present invention, it is preferable that the laminated ceramic electronic component is housed in each of the cavities in a state in which extraction directions of the internal electrodes are aligned.

In the serial taping electronic component according to a preferred embodiment of the present invention, as the laminated ceramic electronic component, the above-mentioned laminated ceramic electronic component of various preferred embodiments of the present invention is preferably used, and it is possible to reliably recognize a direction in which the internal electrodes are extended. Therefore, it is possible to obtain the serial taping electronic component where the laminated ceramic electronic component is housed in each of the cavities in a state in which the extraction directions of the internal electrodes are aligned. In addition, from this serial taping electronic component, each laminated ceramic electronic component is sequentially supplied that is housed in each cavity in state where the extraction directions of the internal electrodes are aligned, and the laminated ceramic electronic component is mounted on a mounting target such as a circuit substrate. Accordingly, it is possible to efficiently mount each laminated ceramic electronic component on the mounting target with aligning directions such as the directions of the main surfaces of the internal electrodes.

In addition, it is preferable that, in a form where the first wrap-around electrode portion in the first electrode portion is located in an outer side portion of the second electrode portion and the first wrap-around electrode portion faces an aperture portion of the cavity, or in a form where the second wrap-around electrode portion in the second electrode portion is located in an outer side portion of the first electrode portion and the second wrap-around electrode portion faces an aperture portion of the cavity, the laminated ceramic electronic component is housed in each of the cavities.

The above-mentioned configuration is included, and hence, it is possible to reliably obtain the serial taping electronic component where the laminated ceramic electronic component is housed in each of the cavities in a state where a direction is aligned so that the main surfaces of the internal electrodes thereof become parallel or approximately parallel or vertical or approximately vertical to the bottom surface of the cavity.

In addition, it is preferable that the first wrap-around electrode portion faces an aperture portion of the cavity and the laminated ceramic electronic component is housed in each of the cavities in such a posture that main surfaces of the internal electrodes become parallel or approximately parallel to a bottom surface of the cavity.

As described above, by causing the first wrap-around electrode portion to face the aperture portion of the cavity, it is possible to reliably obtain the serial taping electronic component where the laminated ceramic electronic component is housed in each of the cavities in such a posture that the main surfaces of the internal electrodes thereof become approximately parallel to the bottom surface of the cavity.

In addition, it is preferable that the second wrap-around electrode portion faces an aperture portion of the cavity and the laminated ceramic electronic component is housed in each of the cavities in such a posture that main surfaces of the internal electrodes become parallel or approximately parallel to a bottom surface of the cavity.

As described above, by causing the second wrap-around electrode portion to face the aperture portion of the cavity, it is possible to reliably obtain the serial taping electronic component where the laminated ceramic electronic component is housed in each of the cavities in such a posture that the main surfaces of the internal electrodes thereof become vertical or approximately vertical to the bottom surface of the cavity and the first and second side surfaces of the ceramic element body, to which the internal electrodes are extended, become parallel or approximately parallel to the bottom surface of the cavity.

In addition, by observing the external appearance configuration of each laminated ceramic electronic component housed in the cavity, a direction in which the internal electrodes are extended or the posture of the laminated ceramic electronic component (for example, whether the internal electrodes are parallel or approximately parallel or vertical to the bottom surface of the cavity) is recognizable. Therefore, even if, in the stage of the serial taping electronic component, the directions of the laminated ceramic electronic components are not aligned (the laminated ceramic electronic components are randomly housed), a configuration may also be adopted where the laminated ceramic electronic component is sequentially extracted from the serial taping electronic component, and supplied after the posture thereof has been aligned.

In addition, in a manufacturing method for a serial taping electronic component according to a preferred embodiment of the present invention, the serial taping electronic component including a carrier tape configured to include a plurality of cavities, and a laminated ceramic electronic component configured to be housed in each of the cavities, the manufacturing method includes a process in which the laminated ceramic electronic component according to any one of the preferred embodiments of the present invention is housed in each of the cavities.

In addition, it is preferable that the manufacturing method for a serial taping electronic component according to a preferred embodiment of the present invention further includes identifying extraction directions of the internal electrodes by observing external appearance configurations of the first wrap-around electrode portion and the second wrap-around electrode portion, and housing the laminated ceramic electronic component in each of the cavities in a state where the extraction directions of the internal electrodes are aligned.

The above-mentioned configuration is included, and hence, it is possible to reliably manufacture the serial taping electronic component where the laminated ceramic electronic component is housed in each of the cavities in a state where the main surfaces of the internal electrodes thereof become parallel or approximately parallel or vertical or approximately vertical to the bottom surface of the cavity.

In addition, it is preferable that the manufacturing method for a serial taping electronic component according to a preferred embodiment of the present invention further includes using, as the laminated ceramic electronic component, the laminated ceramic electronic component according to any one of the preferred embodiments of the present invention, identifying extraction directions of the internal electrodes by observing, from the outside, which of the first wrap-around electrode portion and the second wrap-around electrode portion is located in an outer side portion, and housing the laminated ceramic electronic component in each of the cavities in a state where the extraction directions of the internal electrodes are aligned.

The above-mentioned configuration is included, and hence, it is possible to reliably recognize the first and second side surfaces of the ceramic element body, to which the internal electrodes are extended, by observing, from the outside, which of the first and second wrap-around electrode portions is located in the outer side portion. Therefore, it is possible to efficiently and reliably manufacture the serial taping electronic component where the laminated ceramic electronic component is housed in each of the cavities in a state where the extraction directions of the internal electrodes are aligned.

In addition, it is preferable that the manufacturing method for a serial taping electronic component according to a preferred embodiment of the present invention further includes a process in which the laminated ceramic electronic component is housed in each of the cavities in such a posture that main surfaces of the internal electrodes become parallel or approximately parallel to a bottom surface of the cavity.

In the manufacturing method for a serial taping electronic component according to a preferred embodiment of the present invention, by causing the first wrap-around electrode portion to face the aperture portion of the cavity, it is possible to efficiently and reliably manufacture the serial taping electronic component where the laminated ceramic electronic component is housed in each of the cavities in such a posture that the main surfaces of the internal electrodes thereof become parallel or approximately parallel to the bottom surface of the cavity and the first and second side surfaces of the ceramic element body, to which the internal electrodes are extended, become a pair of vertical or approximately vertical surfaces not exposed on the aperture portion of the cavity.

In addition, it is preferable that the manufacturing method for a serial taping electronic component according to a preferred embodiment of the present invention further includes a process in which the laminated ceramic electronic component is housed in each of the cavities in such a posture that main surfaces of the internal electrodes become vertical or approximately vertical to a bottom surface of the cavity.

In addition, in the manufacturing method for a serial taping electronic component according to a preferred embodiment of the present invention, by causing the second wrap-around electrode portion to face the aperture portion of the cavity, it is possible to efficiently and reliably manufacture the serial taping electronic component where the laminated ceramic electronic component is housed in each of the cavities in such a posture that the main surfaces of the internal electrodes thereof become vertical or approximately vertical to the bottom surface of the cavity and the first and second side surfaces of the ceramic element body, to which the internal electrodes are extended, become parallel or approximately parallel to the bottom surface of the cavity.

In addition, a direction identification method for a laminated ceramic electronic component is a method for identifying a direction of the laminated ceramic electronic component according to any one of the preferred embodiments of the present invention and mounted on a mounting target, the direction identification method including recognizing extraction directions of the internal electrodes and identifying a direction of the laminated ceramic electronic component, by observing an external appearance configuration of at least one of the first wrap-around electrode portion and the second wrap-around electrode portion after the laminated ceramic electronic component has been mounted.

In addition, it is preferable that, in a direction identification method for a laminated ceramic electronic component according to a preferred embodiment of the present invention, the laminated ceramic electronic component is the laminated ceramic electronic component according to any one of the preferred embodiments of the present invention, and the direction identification method includes recognizing extraction directions of the internal electrodes and identifying a direction of the laminated ceramic electronic component, by observing, from the outside, which of the first wrap-around electrode portion and the second wrap-around electrode portion is located in an outer side portion.

The above-mentioned configuration is included, and hence, it is possible to reliably recognize the first and second side surfaces of the ceramic element body, to which the internal electrodes are extended, by observing, from the outside, which of the first and second wrap-around electrode portions is located in the outer side portion, and it is possible to cause preferred embodiments of the present invention to be more effective.

In addition, it is preferable that the direction identification method for a laminated ceramic electronic component according to a preferred embodiment of the present invention further includes observing the external appearance configuration in a top surface of the laminated ceramic electronic component, from above a mounting surface, in a state of being mounted in the mounting target.

The above-mentioned configuration is included, and hence, it is possible to easily and reliably recognize the first and second side surfaces of the ceramic element body, to which the internal electrodes are extended, by observing the external appearance configuration in the top surface of the laminated ceramic electronic component, from above the mounting surface, and significant results are achieved.

Furthermore, it is preferable that the direction identification method for a laminated ceramic electronic component according to a preferred embodiments of the present invention further includes observing the external appearance configuration in a side surface of the laminated ceramic electronic component.

By observing the external appearance configuration in the side surface in addition to the top surface of the laminated ceramic electronic component, it is possible to more reliably recognize the first and second side surfaces of the ceramic element body, to which the internal electrodes are extended.

In addition, by observing from the outside, it is possible to easily identify the extraction directions of the internal electrodes or whether the internal electrodes are parallel or approximately parallel or vertical to the mounting surface of a mounting target.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4A is a diagram illustrating a configuration of an internal electrode extended to a side surface of a ceramic element body, and FIG. 4B is a diagram illustrating a configuration of an internal electrode extended to an end surface of a ceramic element body.

FIG. 6A is a plan view illustrating a main portion configuration of a serial taping electronic component according to a preferred embodiment of the present invention, and FIG. 6B is an elevational cross-sectional view illustrating a main portion configuration thereof.

FIGS. 9A to 9C are diagrams for explaining a direction identification method for a laminated ceramic electronic component according to a preferred embodiment of the present invention, FIG. 9A is a plan view illustrating a laminated ceramic electronic component mounted on a mounting target, FIG. 9B is a front view, and FIG. 9C is a line cross-sectional view of FIG. 9B, taken along a line C-C.

FIG. 10A is a plan view illustrating a laminated ceramic electronic component mounted on a mounting target, FIG. 10B is a front view, and FIG. 10C is a cross-sectional view of FIG. 10B, taken along a line C-C.

DETAILED DESCRIPTION OF THE PREFERRED EMBODIMENTS

Hereinafter, preferred embodiments of the present invention will be illustrated, and the features of preferred embodiments of the present invention will be described in more detail.

First Preferred Embodiment

Here, a laminated ceramic electronic component (laminated ceramic capacitor) according to a preferred embodiment (first preferred embodiment) of the present invention and a manufacturing method therefor will be described.

Figure 1:
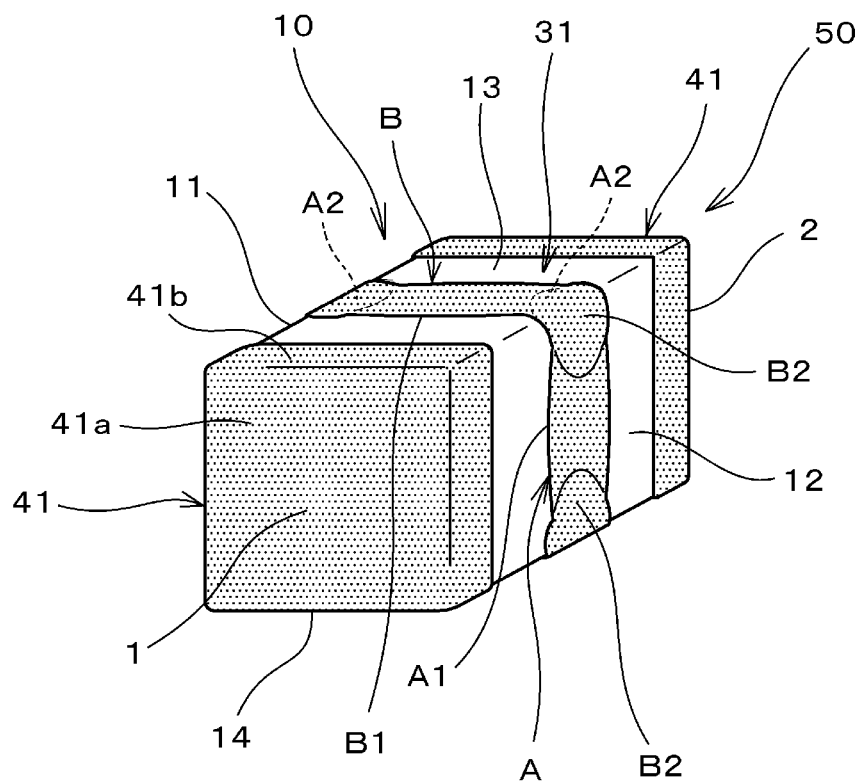
FIG. 1 is a perspective view of a laminated ceramic electronic component according to a preferred embodiment of the present invention.
Figure 2:
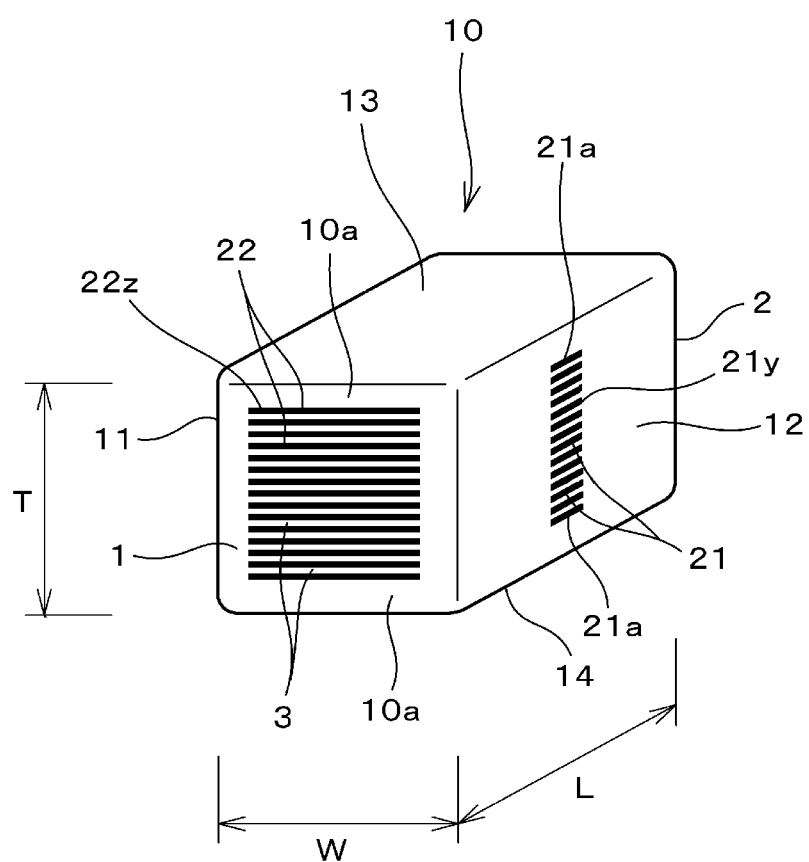
FIG. 2 is a perspective view of a ceramic element body configuring a laminated ceramic capacitor according to a preferred embodiment of the present invention.
Figure 3:
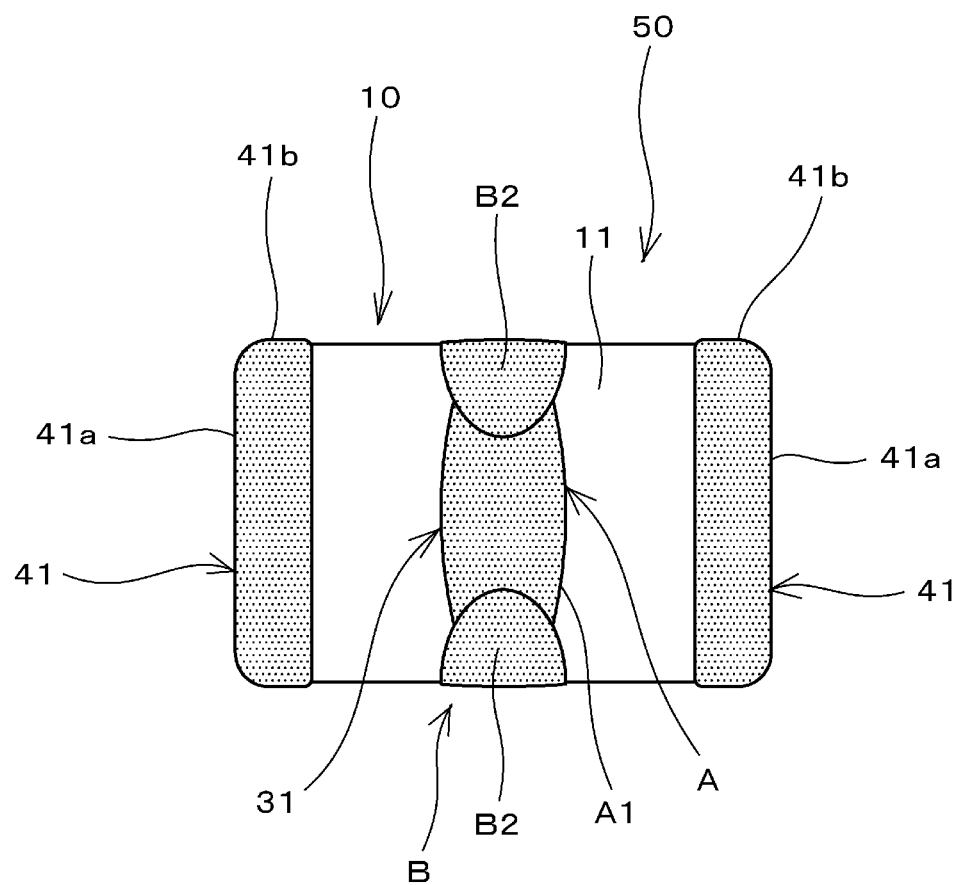
FIG. 3 is a diagram illustrating a state where a laminated ceramic capacitor according to a preferred embodiment of the present invention is viewed from a first side surface side.

FIG. 1 is a perspective view illustrating a laminated ceramic electronic component (three-terminal type laminated ceramic capacitor) according to a first preferred embodiment of the present invention, FIG. 2 is a perspective view illustrating the configuration of a ceramic element body configuring the corresponding laminated ceramic capacitor, and FIG. 3 is a diagram illustrating a state where the laminated ceramic capacitor according to the first preferred embodiment of the present invention is viewed from a first side surface side.

This laminated ceramic capacitor 50 is formed preferably by laminating a plurality of ceramic layers 3, and includes a ceramic element body 10 including a first end surface 1 and a second end surface 2, which face each other, and a first side surface 11, a second side surface 12, a third side surface 13, and a fourth side surface 14, which link the first and second end surfaces 1 and 2 with each other and face each other.

Figure 4A:
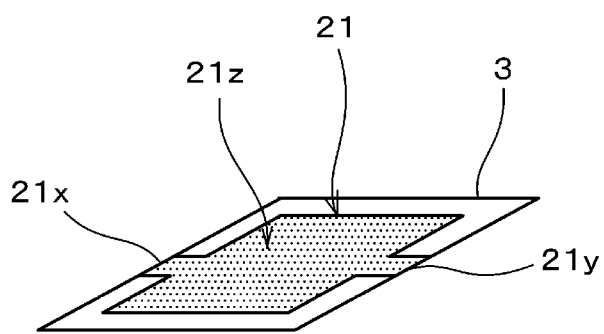
FIGS. 4A and 4B are diagrams illustrating internal electrodes of a laminated ceramic capacitor according to a preferred embodiment of the present invention.

In addition, within the ceramic element body 10, as illustrated in FIG. 4A, a plane surface has a cross shape or a substantially cross shape, and a plurality of first internal electrodes (side surface extraction internal electrodes) 21 (FIG. 4A) are provided in each of which a pair of end portions 21x and 21y facing each other is extended to the first and second side surfaces 11 and 12. Furthermore, within the ceramic element body 10, a plurality of second internal electrodes (end surface extraction internal electrodes) 22 (FIG. 4B) are provided that face the first internal electrodes (side surface extraction internal electrodes) 21 through the ceramic layers 3 and in each of which a pair of end portions 22x and 22y facing each other is extended to the first and second end surfaces 1 and 2.

In addition, this laminated ceramic capacitor 50 includes a belt-shaped or substantially belt-shaped side surface outer electrode 31 arranged on the first, second, third, and fourth side surfaces 11, 12, 13, and 14 of the ceramic element body 10 so as to circle around the ceramic element body 10, the side surface outer electrode 31 being connected to the first internal electrodes (side surface extraction internal electrodes) 21 extended to the first and second side surfaces 11 and 12.

In addition, in the first and second end surfaces 1 and 2 of the ceramic element body 10, an end surface outer electrode is provided that is connected to the second internal electrodes (end surface extraction internal electrodes) 22 extended to the first and second end surfaces 1 and 2.

Furthermore, the side surface outer electrode 31 includes a first electrode portion A including a side surface electrode portion A1 arranged on the first and second side surfaces 11 and 12 and a wrap-around electrode portion A2 arranged to extend from the side surface electrode portion A1 and wrap around portions of the third and fourth side surfaces 13 and 14, and a second electrode portion B including a side surface electrode portion B1 arranged on the third and fourth side surfaces 13 and 14 and a wrap-around electrode portion B2 arranged to extend from the side surface electrode portion B1 and wrap around portions of the first and second side surfaces.

In addition, the wrap-around electrode portion B2 in the second electrode portion B is arranged to reach a region covering a portion of an outermost layer internal electrode 21a located in an outermost portion, from among the plural first internal electrodes (side surface extraction internal electrodes) 21, the portion of the outermost layer internal electrode 21a being exposed on the first and second side surfaces 11 and 12 of the ceramic element body 10. In addition, in this first preferred embodiment, the length of the wrap-around portion of the wrap-around electrode portion B2 (a distance from the ridge line portion of the ceramic element body 10 to the leading end of the wrap-around electrode portion B2) preferably is longer than a distance of the wrap-around electrode portion A2, which extends from the ridge line portion of the ceramic element body 10 to the leading end thereof.

Hereinafter, the laminated ceramic electronic component (laminated ceramic capacitor) according to the first preferred embodiment of the present invention will be described in more detail.

As described above, the ceramic element body 10 configuring the laminated ceramic capacitor 50 of this first preferred embodiment is formed preferably by laminating the plural ceramic layers 3, and the ceramic element body 10 is provided that includes the first end surface 1 and the second end surface 2, which face each other, and the first side surface 11, the second side surface 12, the third side surface 13, and the fourth side surface 14, which link the first and second end surfaces 1 and 2 with each other and face each other.

The ceramic element body 10 preferably has a prism or substantially quadrangular prism shape (rectangular or substantially rectangular parallelepiped shape) in which the first and second end surfaces 1 and 2 preferably have square or substantially square shapes. In the ceramic element body 10, the corner portions and the ridge portions thereof preferably are chamfered and rounded.

Here, as illustrated in FIG. 2, when a distance (length) connecting the first and second end surfaces 1 and 2 is defined as L, the direction thereof is defined as an L direction, a distance (width) connecting the first and second side surfaces is defined as W, the direction thereof is defined as a W direction, a distance (thickness) connecting the third and fourth side surfaces is defined as T, and the direction thereof is defined as a T direction, the ceramic element body 10 has a laminated structure including the plural ceramic layers 3 that extend in the W direction and the L direction and are laminated in the T direction.

In addition, it is preferable that the ceramic element body 10 has a prism shaped or substantially prism shaped structure in which lengths in the W direction and the T direction (in other words, the width W and the thickness T) are equal or approximately equal to each other and the first and second end surface 1 and 2 have square or substantially square shapes.

In addition, it is preferable that the thickness of each ceramic layer is about 0.5 μm to about 10 μm, for example.

As a ceramics material configuring the ceramic layer, a dielectric ceramic may be used whose main component is, for example, $BaTiO_3$, $CaTiO_3$, $SrTiO_3$, $CaZrO_3$, or the like. In addition, a dielectric ceramic may also be used where an accessory component such as a Mn compound, a Mg compound, a Si compound, a Co compound, a Ni compound, or a rare earth element compound is added to these components.

As described above, as internal electrodes, the laminated ceramic capacitor 50 of this first preferred embodiment includes the plural first internal electrodes (side surface extraction internal electrodes) 21 extended to the first and second side surfaces 11 and 12 and the plural second internal electrodes (end surface extraction internal electrodes) 22 extended to the first and second end surfaces 1 and 2.

In addition, the plural first internal electrodes (side surface extraction internal electrodes) 21 and the plural second internal electrodes (end surface extraction internal electrodes) 22 are alternately laminated (arrayed) through the ceramic layers in the lamination direction of the ceramic element body 10, that is to say, the T direction.

In the laminated ceramic capacitor 50 according to this first preferred embodiment, the first internal electrode (side surface extraction internal electrode) 21 is configured so as to function as a ground electrode.

As illustrated in FIG. 4A, the first internal electrode 21 is configured so that the planar shape thereof preferably is cross shaped or substantially cross shaped and the central portion thereof functions as a facing portion 21z facing the facing portion 22z of the second internal electrode 22 adjacent thereto through the ceramic layer 3.

In addition, the pair of end portions 21x and 21y in the first internal electrode (side surface extraction internal electrode) 21, which face each other, is individually exposed on the first and second side surfaces 11 and 12 of the ceramic element body 10. In other words, the first internal electrode 21 is configured so as to extend from the first side surface 11 to the second side surface 12.

In the laminated ceramic capacitor 50 according to this first preferred embodiment, the second internal electrode (end surface extraction internal electrode) 22 preferably is configured so as to function as a signal electrode.

Figure 4B:
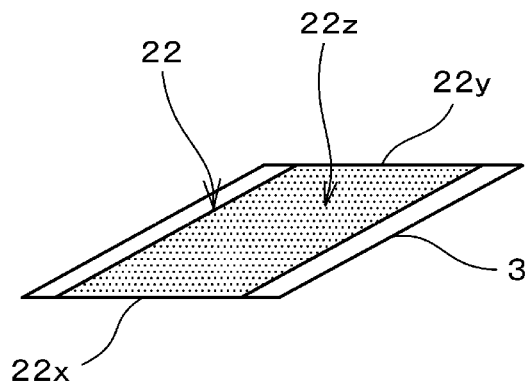

As illustrated in FIG. 4B, the second internal electrode 22 is configured in a belt shape or substantially belt shape whose width is wide, and the pair of end portions 22x and 22y facing each other is individually exposed on the first and second end surfaces 1 and 2 of the ceramic element body 10. In other words, the second internal electrode 22 is configured so as to extend from the first end surface 1 to the second end surface 2.

In addition, the central portion of the second internal electrode (end surface extraction internal electrode) 22 is configured so as to function as the facing portion 22z facing the facing portion 21z of the first internal electrode 21 adjacent thereto through the ceramic layer 3.

In addition, as a conductive material configuring the first and second internal electrodes 21 and 22, for example, Ni, Cu, Ag, Pd, Ag—Pd alloy, Au, or the like may be used.

In addition, it is preferable that the thickness of each of the first and second internal electrodes 21 and 22 is about 0.3 μm to about 2.0 μm, for example.

In addition, in the laminated ceramic capacitor 50 of this first preferred embodiment, an electrostatic capacity occurs in a region where the facing portion 21z of the first internal electrode 21 and the facing portion 22z of the second internal electrode 22 face each other through the ceramic layer 3. In addition, in this first preferred embodiment, the region where the electrostatic capacity occurs is defined as an effective portion.

On the other hand, the region of an outer side portion where neither of the first internal electrode 21 and the second internal electrode 22 exists in the lamination direction of the ceramic layer 3 is defined as an outer layer portion.

In the laminated ceramic capacitor 50 of this first preferred embodiment, outer layer portions 10a (refer to FIG. 2) individually exist on a third side surface 13 side and a fourth side surface 14 side in the ceramic element body 10.

In addition, while it is preferable that the thickness of the outer layer portion 10a (a dimension in the T direction) is comparable and equivalent to a dimension (a gap dimension) in the W direction, which extends from the first side surface 11 or the second side surface 12 of the ceramic element body 10 to the second internal electrode 22, the thickness of the outer layer portion 10a (a dimension in the T direction) may also be formed so as to be thinner than the dimension (a gap dimension) in the W direction. On the other hand, when the thickness of the outer layer portion 10a becomes excessively thick, an undesired increase in the size of a product is caused. Therefore, in the laminated ceramic capacitor 50 of this first preferred embodiment, it is preferable that the thickness of the outer layer portion is less than or equal to about 60 μm, for example.

As described above, the laminated ceramic electronic component of this first preferred embodiment includes the side surface outer electrode 31 provided on the first and second side surfaces 11 and 12 and the end surface outer electrode 41 provided on the first and second end surfaces, as outer electrodes.

In addition, the side surface outer electrode 31 and the end surface outer electrode 41 are connected to different electric potentials.

In addition, it is preferable that the side surface outer electrode 31 and the end surface outer electrode 41 have configurations including base layers (outer electrode main bodies) and plated layers provided thereon.

In this first preferred embodiment, the side surface outer electrode 31 and the end surface outer electrode 41 include base layers where a conductive paste containing metal powder and glass is applied and fired.

As a metal configuring the base layer, for example, Cu, Ni, Ag, Pd, Ag—Pd alloy, Au, or the like may be used.

It is preferable that the thickness of the base layer is about 10 μm to about 50 μm, for example.

As a metal configuring the plated layer, for example, Cu, Ni, Ag, Pd, Ag—Pd alloy, Au, or the like may be used.

The plated layer may also include a plurality of plated layers. As a preferable example, a double-layered structure may be cited that includes a Ni plated layer and a Sn plated layer.

It is preferable that the thickness of each layer serving as the plated layer is about 1 μm to about 20 μm in the thickest portion, for example.

The side surface outer electrode 31 functioning as a ground electrode in the laminated ceramic capacitor 50 of this first preferred embodiment is arranged so as to circle around the first to fourth side surfaces 11 to 14 of the ceramic element body 10.

In addition, as described above, in the laminated ceramic capacitor 50 of this first preferred embodiment, the side surface outer electrode 31 includes the first electrode portion A including the side surface electrode portion A1 provided on the first and second side surfaces 11 and 12 and the wrap-around electrode portion A2 arranged to extend from the side surface electrode portion A1 and wrap around portions of the third and fourth side surfaces 13 and 14, and the second electrode portion B including the side surface electrode portion B1 provided on the third and fourth side surfaces 13 and 14 and the wrap-around electrode portion B2 arranged to extend from the side surface electrode portion B1 and wrap around portions of the first and second side surfaces. In addition, as described above, in this first preferred embodiment, the length of the wrap-around portion of the wrap-around electrode portion B2 (a distance from the ridge line portion of the ceramic element body 10 to the leading end of the wrap-around electrode portion B2) is configured so as to be longer than that of the wrap-around electrode portion A2.

In addition, while any one of the wrap-around electrode portion A2 in the first electrode portion A and the wrap-around electrode portion B2 in the second electrode portion B may be located on an upper layer side or a lower layer side, it may be important that, in a relationship with the directions of the internal electrodes, which thereof is located on the upper layer side or the lower layer side is preliminarily set.

In other words, if which of the wrap-around electrode portion A2 in the first electrode portion A and the wrap-around electrode portion B2 in the second electrode portion B is located on the upper layer side, more specifically, which of the wrap-around electrode portion A2 and the wrap-around electrode portion B2 is located on the upper layer side, compared with the side surface electrode portions A1 and B1, is preliminarily set, the extraction direction of the first internal electrode (side surface extraction internal electrode) 21 or the directions of the main surfaces of the first internal electrode (side surface extraction internal electrode) 21 and the second internal electrode (end surface extraction internal electrode) 22 and the external appearance state of the side surface outer electrode (which of the wrap-around electrode portion B2 and the wrap-around electrode portion A2 is located on the upper layer side) come into a given relationship. Therefore, by observing the external appearance states of the wrap-around electrode portions A2 and B2, it is possible to easily and reliably identify the directions of the internal electrodes (first and second internal electrodes) 21 and 22. Naturally, it is possible to identify not only which of the wrap-around electrode portions A2 and B2 is located on the upper layer side, but also the direction of the laminated ceramic capacitor based on, for example, the lengths or shapes of the wrap-around portions of the wrap-around electrode portions A2 and B2.

For example, when the laminated ceramic capacitor is mounted with the direction thereof aligned so that the main surfaces of the internal electrodes (the first and second internal electrodes) 21 and 22 become parallel or approximately parallel (or vertical) to the mounting surface of a mounting target such as a circuit substrate or when the laminated ceramic capacitor is housed in the cavity of a carrier tape configuring a taping component, with the direction thereof aligned so that the main surfaces of the internal electrodes (the first and second internal electrodes) 21 and 22 become parallel or approximately parallel (or vertical) to the bottom surface of the cavity, it is possible to identify the direction of the laminated ceramic electronic component based on, for example, which of the wrap-around electrode portions A2 and B2 is located on the upper layer side or a difference in the lengths or shapes of the wrap-around portions of the wrap-around electrode portions A2 and B2, by observing the external appearance state, and mount or house the laminated ceramic electronic component with aligning the direction thereof, in other words, it is possible to mount the laminated ceramic electronic component with aligning the direction thereof so that the main surface of the internal electrode become parallel or approximately parallel (or vertical) to the mounting surface or house the laminated ceramic electronic component with aligning the direction thereof so that the main surface of the internal electrode become parallel or approximately parallel (or vertical) to the cavity.

For example, when the wrap-around electrode portion B2 in the second electrode portion B is located on the upper layer side of the side surface electrode portion A1 (when the wrap-around electrode portion B2 is provided on the side surface electrode portion A1), it is recognized that a surface where the boundary line of the wrap-around electrode portion B2 of the side surface outer electrode 31 is viewed is the first side surface 11 or the second side surface 12 to which the first internal electrode (side surface extraction internal electrode) 21 is extended. In other words, if it is confirmed that the wrap-around electrode portion B2 "does not exist" on the top surface side of the ceramic element body 10, that is to say, the boundary line of the wrap-around electrode portion B2 is not viewed, it is recognized that the main surfaces of the internal electrodes (the first and second internal electrodes) 21 and 22 are parallel or approximately parallel to that surface (top surface).

In addition, for example, when the wrap-around electrode portion A2 in the first electrode portion A is located on the upper layer side of the side surface electrode portion B1 (when the wrap-around electrode portion A2 is provided on the side surface electrode portion B1), it is recognized that a surface where the wrap-around boundary line of the wrap-around electrode portion A2 is viewed is the third side surface 13 or the fourth side surface 14. In other words, if it is confirmed that the boundary line of the wrap-around electrode portion A2 "exists" on the top surface side of the ceramic element body 10, it is recognized that the main surfaces of the internal electrodes (the first and second internal electrodes) 21 and 22 are parallel or approximately parallel to that surface (top surface).

In addition, as a method for confirming that the boundary line of the wrap-around electrode portion B2 is not viewed and the boundary line of the wrap-around electrode portion A2 "exists", for example, a method may be cited where, after the side surface of the ceramic element body 10 has been subjected to light from a white LED lamp and a light amount has been adjusted so that a difference between the luminances of the wrap-around electrode portion and the side surface electrode portion occurs, the top surface of the ceramic element body 10 is image-captured by a CCD camera disposed in a position perpendicular or substantially perpendicular to the top surface of the ceramic element body 10.

In addition, by preliminarily performing a setting so that a distance of the wrap-around electrode portion A2 in the first electrode portion A, which extends from the first side surface 11 to the leading end thereof, becomes larger than a distance of the wrap-around electrode portion B2 in the second electrode portion B, which extends from the third side surface 13 to the leading end thereof, and by comparing the distance of the wrap-around electrode portion A2, which extends from the first side surface 11 to the leading end thereof, with the distance of the wrap-around electrode portion B2, which extends from the third side surface 13 to the leading end thereof, it may also become possible to easily and reliably identify the directions of the internal electrodes (the first and second internal electrodes) 21 and 22.

In addition, as a method for measuring the distance of the wrap-around electrode portion A2, which extends from the first side surface 11 to the leading end thereof, for example, a method may be cited where, by image-capturing the top surface of the ceramic element body 10 with a CCD camera disposed in a position perpendicular or substantially perpendicular to the top surface of the ceramic element body 10 after the first side surface 11 of the ceramic element body 10 has been subjected to light from a white LED lamp and a light amount has been adjusted so that a difference between the luminances of the wrap-around electrode portion and the side surface electrode portion occurs, the boundary line of the wrap-around electrode portion A2 is confirmed and a distance between a line segment tangent to the first side surface 11 and a line segment substantially perpendicular to the leading end of the boundary line of the wrap-around electrode portion A2 is measured.

In addition, as a method for measuring the distance of the wrap-around electrode portion B2, which extends from the third side surface 13 to the leading end thereof, for example, a method may be cited where, by image-capturing the top surface of the ceramic element body 10 using a CCD camera disposed in a position perpendicular or substantially perpendicular to the top surface of the ceramic element body 10 after the third side surface 13 of the ceramic element body 10 has been subjected to light from a white LED lamp and a light amount has been adjusted so that a difference between the luminances of the wrap-around electrode portion and the side surface electrode portion occurs, the boundary line of the wrap-around electrode portion B2 is confirmed and a distance between a line segment tangent to the third side surface 13 and a line segment perpendicular or substantially perpendicular to the leading end of the boundary line of the wrap-around electrode portion B2 is measured.

In addition, in the case of the laminated ceramic capacitor of this first preferred embodiment, since the wrap-around electrode portion B2 in the second electrode portion B is arranged so as to cover the side surface electrode portion A1 in a state where the wrap-around electrode portion B2 in the second electrode portion B is arranged on the side surface electrode portion A1 in the first electrode portion A and an exposed portion of the first internal electrode (side surface extraction internal electrode) 21 in the side surface of the ceramic element body 10 is covered by the side surface electrode portion A1 in the first electrode portion A, the first electrode portion A including the side surface electrode portion A1 provided on the first and second side surfaces 11 and 12 and the wrap-around electrode portion A2 arranged to wrap around portions of the third and fourth side surfaces 13 and 14, it is possible to secure connection reliability between the side surface outer electrode and the internal electrode.

Figure 5:
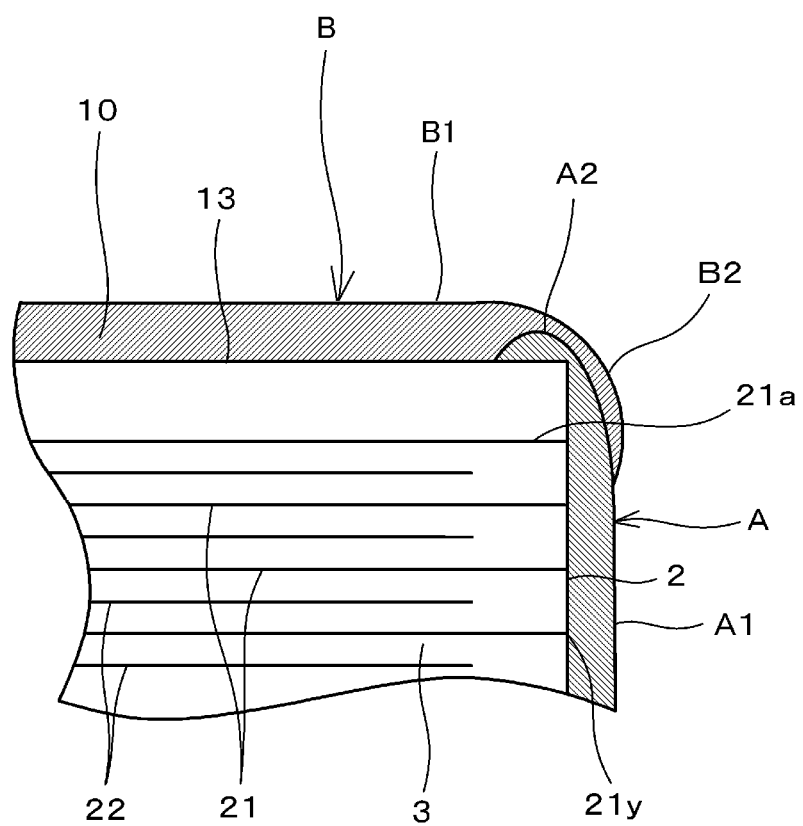
FIG. 5 is a cross-sectional view illustrating a main portion configuration of a laminated ceramic capacitor according to a preferred embodiment of the present invention.

In addition, as illustrated in FIG. 5, since the wrap-around electrode portion B2 in the second electrode portion B is arranged to reach the region covering portions of the outermost layer internal electrode 21*a*, the portions of the outermost layer internal electrode 21*a* being exposed on the first and second side surfaces 11 and 12, it is possible to reliably coat the exposed portions of the outermost layer internal electrode 21*a* with both of the side surface electrode portion A1 and the wrap-around electrode portion B2 and improve moisture resistance. As a result, it is possible to obtain a laminated ceramic electronic component far superior in moisture resistance reliability and superior in the connection reliability between the side surface outer electrode 31 and the first internal electrode (side surface extraction internal electrode) 21.

In addition, the end surface outer electrode 41 functioning as a signal electrode in the laminated ceramic capacitor of this first preferred embodiment is provided on the first and second end surfaces 1 and 2 of the ceramic element body 10.

In addition, the end surface outer electrode 41 includes an end surface electrode portion 41*a*, and a wrap-around electrode portion 41*b* arranged to wrap around the first to fourth side surfaces 11 to 14.

Next, an example of a manufacturing method for the laminated ceramic capacitor according to the first preferred embodiment will be described.

A ceramic green sheet to be a ceramic layer, a conductive paste for an internal electrode, and a conductive paste for an outer electrode are prepared.

While the ceramic green sheet, the conductive paste for an internal electrode, and the conductive paste for an outer electrode contain a binder and a solvent, a well-known binder and a well-known organic solvent may be used.

In addition, on the ceramic green sheet, for example, using a method such as screen printing, the conductive paste for an internal electrode is printed in a predetermined pattern, and an internal electrode pattern is formed.

And then, a predetermined number of the ceramic green sheets, in which various kinds of internal electrode patterns are printed in such a way as described above, and a predetermined number of ceramic green sheets for outer layers, in which no internal electrode pattern is formed, are laminated in a predetermined sequence and a mother laminated body is formed.

In addition, this mother laminated body is pressed in a lamination direction using a method such as rubber pressing. The pressed mother laminated body is cut into a predetermined size, and a raw ceramic element body is cut out.

And then, by firing the raw ceramic element body, a ceramic element body is obtained. Usually it is preferable that a firing temperature is about 900° C. to about 1300° C., for example, depending on a ceramics material or an internal electrode material.

Next, the ceramic element body after firing is subjected to polishing, and the corner portions and the ridge portions of the ceramic element body are chamfered and rounded. As a polishing method, a method such as barrel polishing may be used. Accordingly, the ceramic element body 10 illustrated in FIG. 2 is obtained.

In the ceramic element body after firing, a side surface outer electrode (the base layer thereof) is formed. As for a method for forming the side surface outer electrode (the base layer thereof), as a typical example, a method may be cited where a conductive paste is applied and fired. In addition, no special restriction is placed on a specific method used when the conductive paste is applied and fired, and an adequate method may be arbitrarily selected and used, from among various well-known methods.

For example, a roller transfer method may be used where a roller is used that includes a groove for a conductive paste, which is formed on the circumferential surface thereof, the conductive paste held by the roller is transferred, and hence, the conductive paste is applied to the surface of a ceramic element body (see, for example, paragraphs [0092] and [0093] in Japanese Unexamined Patent Application Publication No. 2012-28502, or Japanese Unexamined Patent Application Publication No. 2001-167989).

When such a roller transfer method is used, the ceramic element body 10 is held in a holding tool, a conductive paste is applied to the first and second side surfaces (two right and left side surfaces) 11 and 12 of the ceramic element body 10 as the first application, and a formed conductive paste applied film is dried.

In addition, in a case where the conductive paste is applied to the first and second side surfaces 11 and 12 on which the side surface extraction internal electrode 21 is exposed, an optical mechanism such as a camera may be used when the first and second side surfaces 11 and 12 are detected on which the side surface extraction internal electrode 21 is exposed. In this regard, however, in terms of enhancing a detection speed and improving productivity, it is preferable that a method for directional alignment is used that utilizes a magnetic force and is described in Japanese Patent No. 3430854.

In addition, in the case of a laminated ceramic capacitor in which a side surface outer electrode circling around a side surface is formed, there is a problem that the accuracy of directional alignment due to a magnetic force is reduced. However, since, at this time point (the stage of a ceramic element body), no side surface outer electrode is formed, it may be possible to array the ceramic element body in a predetermined direction with high accuracy, based on the above-mentioned directional alignment due to the magnetic force.

And then, by applying, for example, the above-mentioned method utilizing the optical mechanism such as a camera, the directional alignment utilizing a magnetic force, or the like, the third and fourth side surfaces (two upper and lower side surfaces) 13 and 14 of the ceramic element body 10 are detected, and the conductive paste is applied to the third and fourth side surfaces (two upper and lower side surfaces) 13 and 14 of the ceramic element body 10 as the second application. Accordingly, it is possible to form the side surface outer electrode 31 (FIG. 1) circling around the ceramic element body 10, and it may be possible to form the wrap-around electrode portion B2.

The length of the wrap-around electrode portion B2 may be changed by adjusting a pressing pressure at the time of roller transfer.

In addition to this, for example, a method may be used where a conductive paste housed in a paste layer is pushed out from a slit formed in a slit plate and applied, using such an apparatus as disclosed in Japanese Unexamined Patent Application Publication No. 2001-57311.

In addition, when any application method is used, it is preferable that, as described above, the application of the conductive paste is performed first on the first and second side surfaces 11 and 12 on which the internal electrode 21 is exposed. However, in some cases, first the conductive paste may be applied to the third and fourth side surfaces (two upper and lower side surfaces) 13 and 14 of the ceramic element body 10, and secondly the conductive paste may be applied to the first and second side surfaces (two right and left side surfaces) 11 and 12 of the ceramic element body 10.

In addition, when the conductive paste is applied, it becomes necessary to detect the first and second side surfaces 11 and 12, on which the internal electrode 21 is exposed, before the application of the conductive paste in a case where the shape of the ceramic element body 10 is a prism shape or a substantially quadrangular prism shape in which the first and second end surfaces 1 and 2 have square or substantially square shapes, for example. However, while, at that time, the presence or absence of the exposure of the internal electrode 21 may be checked by an optical mechanism such as a camera and the first and second side surfaces 11 and 12 may also be detected, the first and second side surfaces 11 and 12 may also be detected by applying the directional alignment utilizing the magnetic force, as described above.

Next, in the end surface of the ceramic element body 10, an end surface outer electrode (the base layer thereof) is formed. When the end surface outer electrode (the base layer thereof) is formed, a conductive paste applied film for an end surface outer electrode is applied to both end surfaces of the ceramic element body.

And then, the conductive paste applied films for a side surface outer electrode and an end surface outer electrode are fired that are formed in such a way as described above. Usually, it is preferable that a firing temperature is about 700° C. to about 900° C., for example.

Accordingly, the side surface outer electrode (the base layer thereof) and the end surface outer electrode (the base layer thereof) are formed.

After that, using, for example, a well-known method such as an electrolytic plating method, plating processing is performed, and a plated layer is formed on the base layer. As the plated layer, plated layers may also be formed on the base layer in the order of a Ni plated layer and a Sn plated layer.

Accordingly, a laminated ceramic capacitor is obtained that has such a structure as illustrated in FIG. 1.

In addition, it is preferable that, as for the dimensions of the laminated ceramic capacitor, for example, a length L is less than or equal to about 1.6 mm, a width W is less than or equal to about 0.8 mm, and a thickness T is less than or equal to about 0.8 mm. The reason is that since direction identification becomes difficult with the miniaturization of a laminated ceramic electronic component, preferred embodiments of the present invention become more meaningful.

Second Preferred Embodiment

In this second preferred embodiment, the configuration of a serial taping component according to various preferred embodiments of the present invention and a manufacturing method therefor will be described.

FIG. 6A is a plan view illustrating the main portion configuration of a serial taping electronic component according to the second preferred embodiment of the present invention, and FIG. 6B is an elevational cross-sectional view.

Figure 7A:
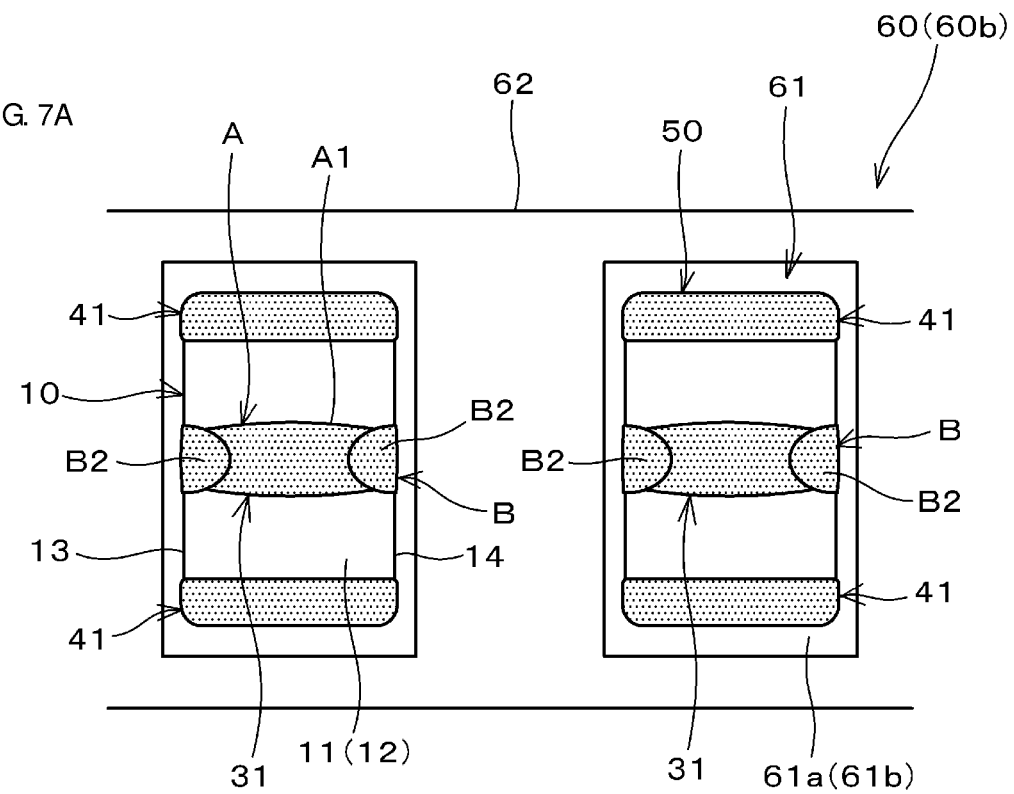
FIG. 7A is a plan view illustrating a main portion configuration of another serial taping electronic component according to a preferred embodiment of the present invention.
Figure 7B:
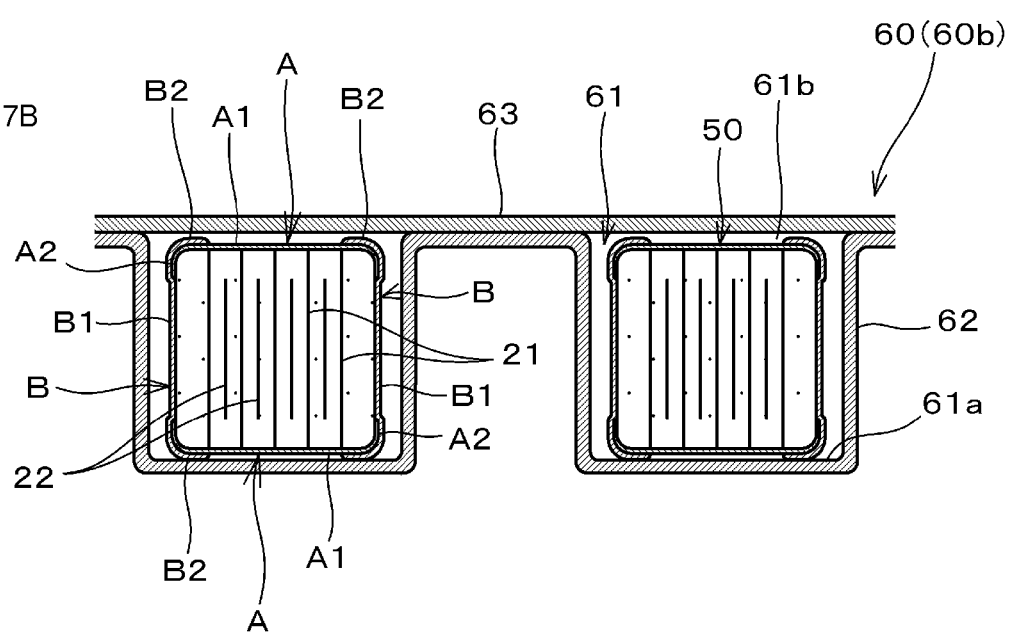
FIG. 7B is an elevational cross-sectional view illustrating a main portion configuration thereof.

In addition, FIG. 7A is a plan view illustrating the main portion configuration of another serial taping electronic component according to the second preferred embodiment of the present invention, and FIG. 7B is an elevational cross-sectional view.

Figure 8A:
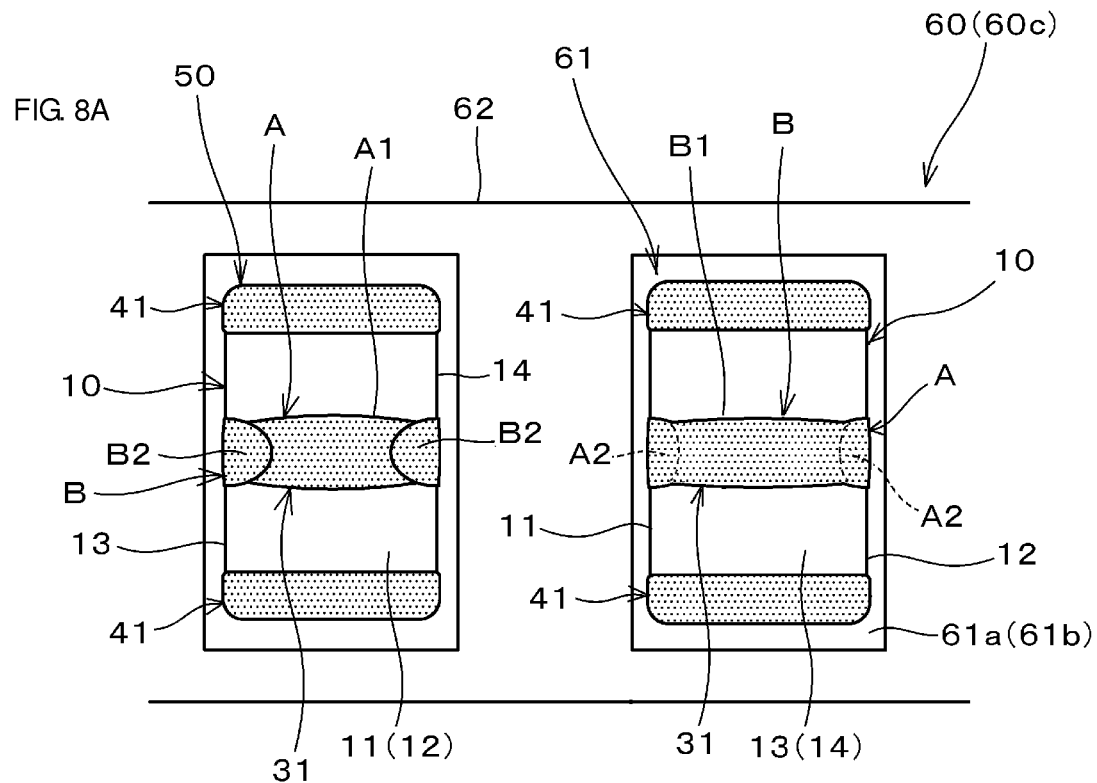
FIG. 8A is a plan view illustrating a main portion configuration of yet another serial taping electronic component according to a preferred embodiment of the present invention.
Figure 8B:
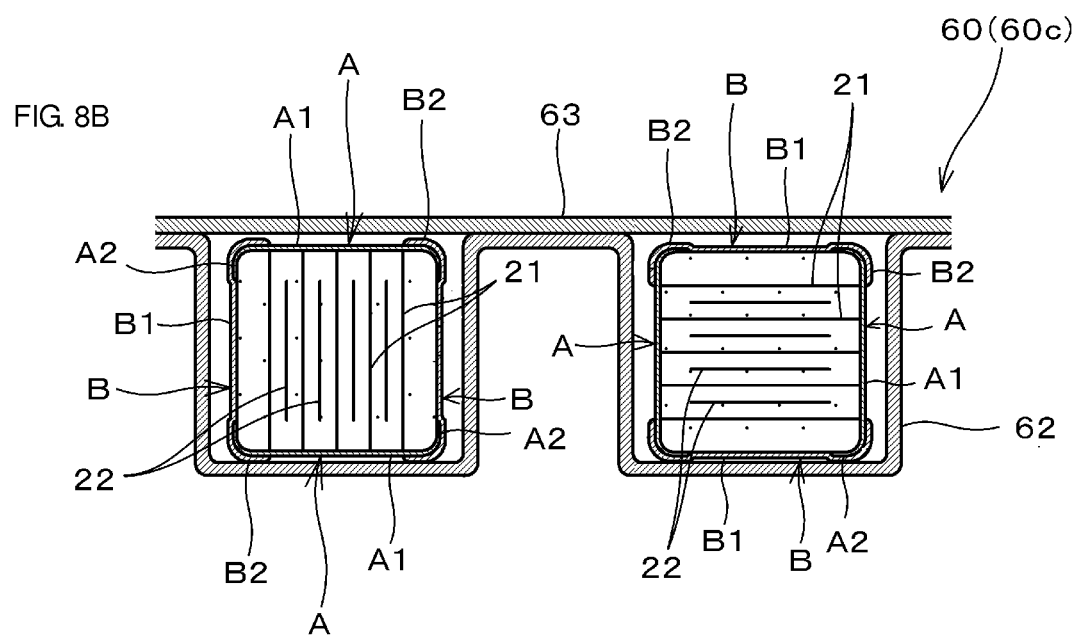
FIG. 8B is an elevational cross-sectional view illustrating a main portion configuration thereof.

Furthermore, FIG. 8A is a plan view illustrating the main portion configuration of yet another serial taping electronic component according to the second preferred embodiment of the present invention, and FIG. 8B is an elevational cross-sectional view.

A serial taping electronic component 60 illustrated in FIGS. 6A and 6B includes a carrier tape 62 in which a plurality of cavities (concave portions) 61 are provided in a plastic base material, an electronic component (laminated ceramic capacitor) 50 housed in each of the plural cavities 61, and a top tape 63 that covers the aperture portion 61b of the cavity 61.

In addition, as the electronic component, the laminated ceramic capacitor 50 according to the above-mentioned first preferred embodiment of the present invention is preferably used.

In addition, as a carrier tape that includes the top tape and configures the serial taping electronic component 60, a carrier tape may be used that has, for example, the following configuration.

(a) A carrier tape configured so that a concave portion (cavity) is provided in a substantially plastic tape-shaped base material, an electronic component is housed within the cavity, and the aperture portion of the cavity is sealed by a top tape (a carrier tape having a configuration including a plastic embossed tape and a top tape). The serial taping electronic component according to this second preferred embodiment corresponds to this.

(b) A carrier tape having a configuration where a low-cost cardboard base material is used for the carrier tape, a through hole is formed in the base material, and cover films (a top tape and a bottom tape) are attached to the two upper and lower main surfaces of the base material in a state in which an electronic component is housed in the through hole.

(c) A carrier tape where a concave portion (cavity) is formed in a main surface on the other side of a base material whose main surface on one side is maintained in a flat or substantially flat configuration, an electronic component is housed in the cavity, and a lid member covering the aperture of the cavity is provided in the main surface on the other side of the base material. This is a carrier tape that is different from the above-mentioned (b) and where a lid member is only attached on one surface (the main surface on the other side) side of the base material.

In the serial taping electronic component 60 (60*a*) illustrated in FIGS. 6A and 6B, each laminated ceramic capacitor 50 is preferably housed within the cavity 61 with the direction thereof aligned so that the main surfaces of the first internal electrode (side surface extraction internal electrode) 21 and the second internal electrode (end surface extraction internal electrode) 22 become parallel or approximately parallel to the bottom surface 61*a* of the cavity 61.

In other words, in this serial taping electronic component 60 (60*a*), each laminated ceramic capacitor 50 is housed in the cavity 61 such that the wrap-around electrode portion B2 in the second electrode portion B is located in a side surface perpendicular or substantially perpendicular to the bottom surface 61*a* of the cavity 61 with not being located in the top surface of the ceramic element body 10, which faces the aperture portion 61*b* of the cavity 61, and the wrap-around electrode portion A2 in the first electrode portion A is located in the top surface of the ceramic element body 10, which faces the aperture portion 61*b* of the cavity 61 (the wrap-around electrode portion A2 is located on the lower side of the side surface electrode portion B1 in the second electrode portion B).

In this way, when the laminated ceramic capacitor 50 is housed within each cavity 61 with the direction thereof aligned so that the main surfaces of the first internal electrode (side surface extraction internal electrode) 21 and the second internal electrode (end surface extraction internal electrode) 22 become parallel or approximately parallel to the bottom surface 61*a* of the cavity 61, the laminated ceramic capacitor 50 is sequentially extracted from the cavity 61 of the serial taping electronic component 60 (60*a*), and mounted on a mounting target such as a circuit substrate using an automatic mounting machine, and hence, it is possible to mount each laminated ceramic capacitor 50 with the direction thereof aligned so that the main surfaces of the internal electrodes efficiently become parallel or approximately parallel to the mounting surface.

In addition, when the laminated ceramic capacitor 50 is mounted with the direction thereof aligned so that the main surfaces of the internal electrodes become parallel or approximately parallel to the mounting surface, it may be possible to improve the moisture resistance of the laminated ceramic capacitor 50. In other words, while moisture easily accumulates in a mounting surface and the moisture resistance easily becomes a problem when the main surfaces of the internal electrodes are mounted so as to become vertical or approximately vertical to the mounting surface, it is possible to reduce the problem of the moisture resistance by mounting with the direction aligned so that the main surfaces of the internal electrodes become parallel or approximately parallel to the mounting surface.

In addition, when the laminated ceramic capacitor 50 is mounted in a mounting target such as a circuit substrate, in some cases the circuit substrate vibrates and an abnormal noise occurs, that is to say, so-called "sounding" occurs, depending on the directions of the internal electrodes, in some cases it is possible to suppress or prevent the occurrence of the sounding by mounting in such a posture that the main surfaces of the internal electrodes become parallel or approximately parallel to the mounting surface.

In addition, in the serial taping electronic component (60*b*) according to another example of the second preferred embodiment, illustrated in FIGS. 7A and 7B, each laminated ceramic capacitor 50 is housed within the cavity 61 with the direction thereof aligned so that the main surfaces of the first internal electrode (side surface extraction internal electrode) and the second internal electrode (end surface extraction internal electrode) 22 become vertical or approximately vertical to the bottom surface 61*a* of the cavity 61.

In this serial taping electronic component 60 (60*b*), each laminated ceramic capacitor 50 is housed in the cavity 61 such that the wrap-around electrode portion B2 in the second electrode portion B is located in the top surface of the ceramic element body 10, which faces the aperture portion 61*b* of the cavity 61.

When, in such a way as in this serial taping electronic component 60 (60*b*), the laminated ceramic capacitor 50 is housed within the cavity 61 with the direction thereof aligned so that the main surfaces of the internal electrodes 21 and 22 become vertical or approximately vertical to the bottom surface 61*a* of the cavity 61, the laminated ceramic capacitor 50 is sequentially extracted from the serial taping electronic component 60 (60*b*), and mounted on a mounting target such as a circuit substrate using an automatic mounting machine, and hence, it is possible to mount each laminated ceramic capacitor 50 with the direction thereof aligned so that the main surfaces of the internal electrodes 21 and 22 efficiently become vertical or approximately vertical to the mounting surface.

In this way, compared with a case where the main surfaces of the internal electrodes are parallel or approximately parallel to the mounting surface, a case where the laminated ceramic capacitor is mounted with the direction thereof aligned so that the main surfaces of the internal electrodes become vertical or approximately vertical to the mounting surface is preferable in that it is possible to reduce ESL by shortening distances between the internal electrodes and mounting lands.

In addition, in some cases, compared with a case where the main surfaces of the internal electrodes are parallel or approximately parallel to the mounting surface, it is also become possible to suppress or prevent so-called "sounding".

While, in the above-mentioned serial taping electronic components 60 (60*a* and 60*b*), the laminated ceramic capacitor 50 is housed in each cavity 61 so that the direction thereof is aligned, that is to say, the main surfaces of the internal electrodes (the first and second internal electrodes) 21 and 22 become parallel or approximately parallel or vertical to the bottom surface 61*a* of the cavity 61, the serial taping electronic component according to preferred embodiments of the present invention may also adopt a configuration where, in such a way as, for example, in the serial taping electronic component 60 (60*c*) illustrated in FIGS. 8A and 8B, the laminated ceramic capacitor 50 is randomly housed in each of the plural cavities 61 (in other words, without the directions of the internal electrodes specifically aligned).

In this serial taping electronic component 60 (60*c*), while the laminated ceramic capacitor 50 is randomly housed in each of the plural cavities 61 (without the directions of the internal electrodes specifically aligned), the laminated ceramic capacitor 50 is configured so that the extraction direction of the first internal electrode 21 or the directions of the main surfaces of the internal electrodes are recognizable from the outside, as described above. Therefore, in a stage where the laminated ceramic capacitor 60 is extracted from the serial taping electronic component and mounted, it is possible to mount after recognizing the direction thereof or mount after aligning the direction as appropriate.

In addition, in this preferred embodiment, a state where the directions of the internal electrodes of the above-mentioned serial taping electronic component are aligned in a given direction means that the housed directions of at least 100 laminated ceramic capacitors housed in the serial taping electronic component are confirmed and the directions of the internal electrodes are aligned in a given direction with a probability of about 75% or more, for example. It is preferable that the directions of the internal electrodes are more desirably aligned with a probability of about 80% or more or far more desirably with a probability of about 90% or more, for example.

In addition, when a configuration is adopted where the laminated ceramic capacitor 50 is randomly housed in each of the plural cavities 61, the directions of the internal electrodes turn out to be aligned in a given direction with a probability of about 50%.

Next, a manufacturing method for the serial taping electronic components 60 (60*a*, 60*b*, and 60*c*) will be described.

The laminated ceramic capacitor 50 is prepared that includes such a configuration as illustrated in FIGS. 1 to 4B and is manufactured in the same method as the method described above.

When the serial taping electronic component 60 (60*a*) illustrated in FIGS. 6A and 6B is manufactured, the laminated ceramic capacitor 50 is housed in each of the plural cavities 61 formed in the carrier tape 62, in the following form.

In other words, the laminated ceramic capacitor 50 is housed in the cavity 61 such that the wrap-around electrode portion B2 in the second electrode portion B is located in a side surface perpendicular or substantially perpendicular to the bottom surface 61*a* of the cavity 61 with not being located in the top surface of the ceramic element body 10, which faces the aperture portion 61*b* of the cavity 61, and the wrap-around electrode portion A2 in the first electrode portion A is located on the lower side of the side surface electrode portion B1 in the second electrode portion B, in the top surface of the ceramic element body 10, which faces the aperture portion 61*b* of the cavity 61.

And then, the top tape 63 is provided in the top surface 62*a* of the carrier tape 62, and the aperture portion 61*b* of the cavity 61 is sealed.

At this time, the top tape 63 may also be joined to the top surface 62*a* of the carrier tape 62 through an adhesive, and the top tape 63 may also be used where an adhesive material is added to a surface joined to the carrier tape. Furthermore, using another method, the top tape 63 may also be joined to the carrier tape 62.

Owing to the above-mentioned procedure, as illustrated in FIGS. 6A and 6B, the serial taping electronic component 60 may be obtained where the laminated ceramic capacitor 50 is housed within the cavity 61 with the direction thereof aligned so that the main surfaces of the internal electrodes become parallel or approximately parallel to the bottom surface 61*a* of the cavity 61.

In addition, as described above, when the laminated ceramic capacitor 50 is housed in the cavity 61 in such a posture that the main surfaces of the internal electrodes become parallel or approximately parallel to the bottom surface 61*a* of the cavity 61, it is preferable that the external appearance configuration of the wrap-around electrode portion A2 or the wrap-around electrode portion B2 is observed using an optical mechanism such as a camera and the laminated ceramic capacitor 50 is housed in the cavity 61 with the direction of the laminated ceramic capacitor 50 set.

In addition, before the confirmation of the external appearance configuration due to the optical mechanism, the above-mentioned directional alignment utilizing the magnetic force may also be implemented. In this case, since the side surface outer electrode has been formed, the accuracy of the alignment is reduced. However, since so-called double check is performed, a non-defective product rate tends to be improved.

In the same way as when the serial taping electronic component 60 (60*a*) illustrated in FIGS. 6A and 6B is manufactured, the laminated ceramic capacitor 50 is prepared that includes such a configuration as illustrated in FIGS. 1 to 4B.

When the serial taping electronic component 60 (60*b*) illustrated in FIGS. 7A and 7B is manufactured, the laminated ceramic capacitor 50 is housed in each of the plural cavities 61 of the carrier tape 62 such that the wrap-around electrode portion B2 in the second electrode portion B is located on the upper side of the side surface electrode portion A1 in the first electrode portion A, in the top surface of the ceramic element body 10, which faces the aperture portion 61*b* of the cavity 61.

And then, In the same way as when the serial taping electronic component 60 (60*a*) illustrated in FIGS. 6A and 6B is manufactured, the top tape 63 is provided in the top surface 62*a* of the carrier tape 62, and the aperture portion 61*b* of the cavity 61 is sealed.

Accordingly, the serial taping electronic component 60 (60*b*) may be obtained where the laminated ceramic capacitor 50 is housed within the cavity 61 with the direction thereof aligned so that the main surfaces of the first internal electrode (side surface extraction internal electrode) 21 and the second internal electrode (end surface extraction internal electrode) 22 become vertical or approximately vertical to the bottom surface 61*a* of the cavity 61.

In addition, when, in the same way as the serial taping electronic component 60 (60*a*) illustrated in FIGS. 6A and 6B and the serial taping electronic component 60 (60*b*) illustrated in FIGS. 7A and 7B, the taping electronic component is manufactured where the laminated ceramic capacitor 50 is housed in each of the plural cavities 61 in such a posture that the main surfaces of the first internal electrode (side surface extraction internal electrode) 21 and the second internal electrode (end surface extraction internal electrode) 22 become parallel or approximately parallel or vertical or approximately vertical to the bottom surface 61*a* of the cavity 61, it is preferable that when the laminated ceramic capacitor 50 is housed in the cavity 61, the external appearance configuration of the wrap-around electrode portion A2 or the wrap-around electrode portion B2 is observed using an optical mechanism such as a camera and the laminated ceramic capacitor 50 is housed in the cavity 61 with the direction of the laminated ceramic capacitor 50 set.

In addition, before the confirmation of the external appearance configuration due to the optical mechanism, the above-mentioned directional alignment utilizing the magnetic force may also be implemented. In this case, since the side surface outer electrode 31 has been formed, the accuracy of the alignment is reduced. However, since so-called double check is performed, it may be possible to improve a non-defective product rate.

In the same way as when the serial taping electronic component 60 (60*a*) illustrated in FIGS. 6A and 6B is manufactured, the laminated ceramic capacitor 50 is prepared that includes such a configuration as illustrated in FIGS. 1 to 4B.

The laminated ceramic capacitor 50 is housed in each of the plural cavities 61. At this time, the laminated ceramic capacitor 50 is housed without the direction thereof (the directions of the internal electrodes 21 and 22) specifically identified.

And then, In the same way as when the serial taping electronic component 60 (60a) illustrated in FIGS. 6A and 6B is manufactured, the top tape 63 is provided in the top surface 62a of the carrier tape 62, and the aperture portion 61b of the cavity 61 is sealed.

Accordingly, the serial taping electronic component 60 (60c) may be obtained where the laminated ceramic capacitor 50 is housed in the cavity 61 without the direction thereof aligned.

In addition, while, in this second preferred embodiment, as an example, a case has been cited and described where, as the laminated ceramic capacitor 50, the laminated ceramic capacitor 50 is used in which the wrap-around electrode portion B2 in the second electrode portion B is located on the upper layer side of the side surface electrode portion A1 (the wrap-around electrode portion B2 is formed on the side surface electrode portion A1), a laminated ceramic capacitor may also be used where the wrap-around electrode portion A2 in the first electrode portion A is located on the upper layer side of the side surface electrode portion B1 (the wrap-around electrode portion A2 is formed on the side surface electrode portion B1).

In other words, as long as which thereof is located on the upper layer side or the lower layer side is preliminarily set in a relationship with the directions of the internal electrodes, it may be possible to reliably identify the directions of the internal electrodes, by observing the external appearance states of the wrap-around electrode portions A2 and B2, and, from the result thereof, it is possible to align the laminated ceramic capacitor in a predetermined direction and house the laminated ceramic capacitor in the cavity.

Third Preferred Embodiment

In this third preferred embodiment, a direction identification method for a laminated ceramic electronic component according to various preferred embodiments of the present invention will be described.

In a case where, from among the serial taping electronic components 60 (60a, 60b, and 60c) manufactured in such a way as described above, the serial taping electronic component 60a (refer to FIGS. 6A and 6B) is mounted, when the laminated ceramic capacitor 50 is sequentially extracted from the cavity 61 of the serial taping electronic component 60a using, for example, an automatic mounting machine, placed on a mounting land 71 located on the mounting surface 70a of a circuit substrate 70, and mounted using a reflow soldering method, usually the laminated ceramic capacitor 50 turns out to be mounted in such a posture that the main surfaces of the internal electrodes 21 and become parallel or approximately parallel to the mounting surface 70a of the circuit substrate 70, as schematically illustrated in FIGS. 9A, 9B, and 9C.

In addition, the laminated ceramic capacitor 50 has the same or substantially the same configuration as the laminated ceramic capacitor manufactured in the above-mentioned first preferred embodiment.

In this case, as for the mounted laminated ceramic capacitor 50, the external appearance configurations of the wrap-around electrode portions A2 and B2 thereof are observed using a method described below, and hence, it is possible to recognize the extraction direction of the first internal electrode 21 and identify the direction of the laminated ceramic electronic component 50.

When, as for the mounted laminated ceramic capacitor 50, the external appearance configurations of the wrap-around electrode portions A2 and B2 thereof are observed, the external appearance configurations of the wrap-around electrode portions A2 and B2 in the top surface of the laminated ceramic capacitor are observed from above the mounting surface 70a of the circuit substrate 70.

In addition, in this laminated ceramic capacitor 50, the wrap-around electrode portion B2 in the second electrode portion B is located on the upper layer side of the side surface electrode portion A1 (the wrap-around electrode portion B2 is formed on the side surface electrode portion A1). Therefore, in a case where, as illustrated in FIG. 9A, the boundary line of the leading end portion of the wrap-around electrode portion B2 is not viewed on the top surface side of the ceramic element body 10 (in a case where the wrap-around electrode portion A2 located on the lower layer side of the side surface electrode portion B1 is recognizable) when the top surface of the ceramic element body 10 configuring the laminated ceramic capacitor 50 is observed from above the mounting surface 70a, that is to say, in a case where it is confirmed that the wrap-around electrode portion B2 does not exist on the top surface side, it is determined (identified) that mounting is performed so that the main surfaces of the first internal electrode (side surface extraction internal electrode) and the second internal electrode (end surface extraction internal electrode) 22 become parallel or approximately parallel to the mounting surface 70a, as illustrated in FIG. 9C.

Furthermore, when the external appearance configuration on the side surface of the laminated ceramic electronic component is observed from a direction parallel or approximately parallel to the mounting surface 70a and the boundary line of the leading end portion of the wrap-around electrode portion B2 is viewable in the side surface of the ceramic element body 10, that is to say, when it is confirmed that the wrap-around electrode portion B2 exists in the corresponding side surface, it is determined (identified) that mounting is performed so that the main surface of the first internal electrode (side surface extraction internal electrode) 21 becomes parallel or approximately parallel to the mounting surface 70a, as illustrated in FIG. 9C.

In addition, while it may be possible to identify the direction of the laminated ceramic capacitor 50 without performing observation from the direction parallel or approximately parallel to the mounting surface 70a, it may be possible to improve the reliability of the direction identification by performing observation from the direction parallel or approximately parallel to the mounting surface 70a at the same time.

Figure 10A:
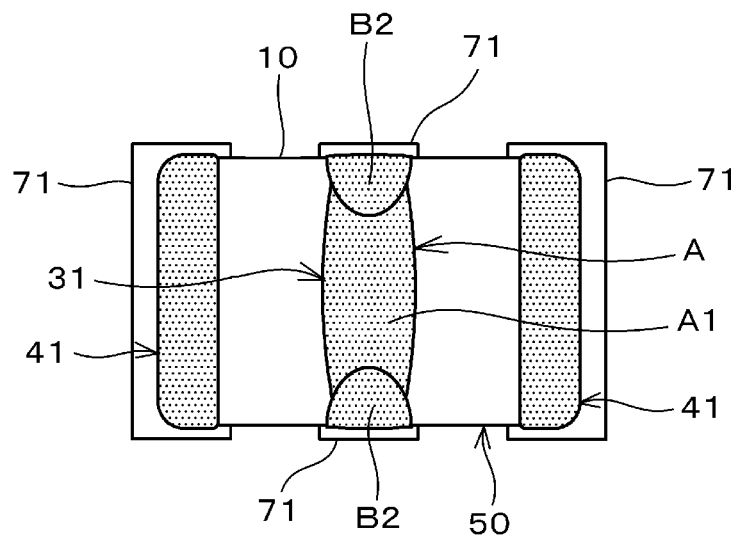
FIGS. 10A to 10C are diagrams for explaining another example of a direction identification method for a laminated ceramic electronic component according to a preferred embodiment of the present invention.
Figure 10B:
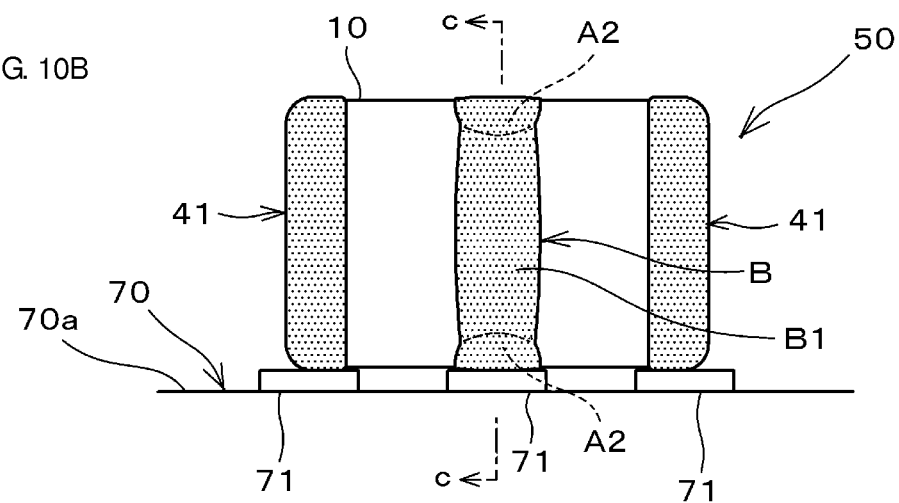
Figure 10C:
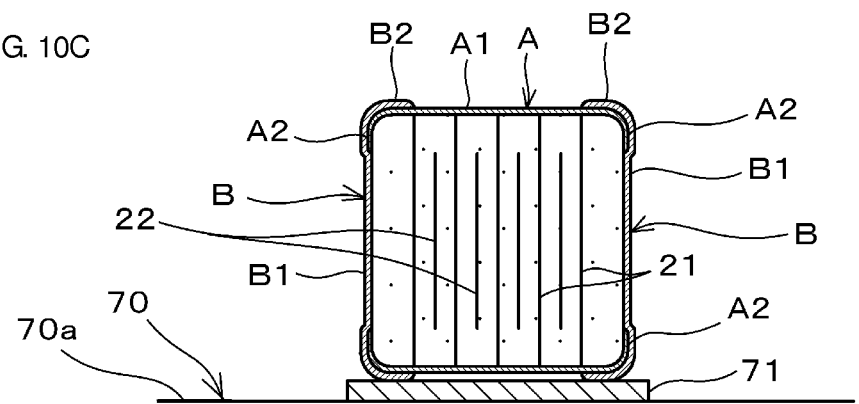
Figure 11:
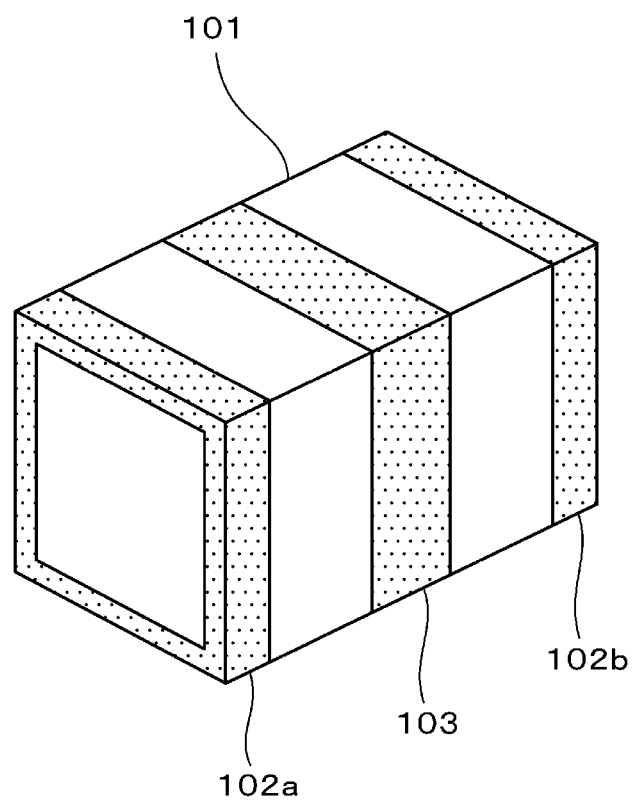
FIG. 11 is a diagram for explaining a problem of a laminated ceramic electronic component of the related art.

In a case where, from among the serial taping electronic components 60 (60a, 60b, and 60c) manufactured in such a way as described above, the serial taping electronic component 60b (refer to FIGS. 7A and 7B) is mounted, when the laminated ceramic capacitor 50 is sequentially extracted from the cavity 61 of the serial taping electronic component 60b using, for example, an automatic mounting machine, placed on a mounting land 71 located on the mounting surface 70a of the circuit substrate 70, and mounted using a reflow soldering method, usually the laminated ceramic capacitor 50 turns out to be mounted in such a posture that the main surfaces of the internal electrodes 21 and become parallel or approximately parallel to the mounting surface 70a of the circuit substrate 70, as schematically illustrated in FIGS. 10A, 10B, and 10C.

Also in this case, as for the mounted laminated ceramic capacitor 50, the external appearance configurations of the wrap-around electrode portions A2 and B2 thereof are observed using a method described below, and hence, it may be possible to recognize the extraction direction of the first internal electrode 21 and identify the direction of the laminated ceramic electronic component 50.

First, in a case where, as illustrated in FIG. 10A, the boundary line of the leading end portion of the wrap-around electrode portion B2 is viewed on the top surface side of the ceramic element body 10 when the top surface of the ceramic element body 10 configuring the laminated ceramic capacitor 50 is observed from above the mounting surface 70a, it is determined (identified) that mounting is performed so that the main surfaces of the first internal electrode (side surface extraction internal electrode) 21 and the second internal electrode (end surface extraction internal electrode) 22 become vertical or approximately vertical to the mounting surface 70a.

Furthermore, when the external appearance configuration in the side surface of the laminated ceramic electronic component is observed from a direction parallel or approximately parallel to the mounting surface 70a and the boundary line of the leading end portion of the wrap-around electrode portion A2 is not viewed in the side surface of the ceramic element body 10, as illustrated in FIG. 10B, (when the existence of the wrap-around electrode portion A2 located on the lower layer side of the side surface electrode portion B1 is recognizable), it is determined (identified) that mounting is performed so that the main surfaces of the first internal electrode (side surface extraction internal electrode) 21 and the second internal electrode (end surface extraction internal electrode) 22 become vertical or approximately vertical to the mounting surface 70a, as illustrated in FIG. 10C.

In addition, also in this case, while it may be possible to identify the direction of the laminated ceramic capacitor 50 without performing observation from the direction parallel or approximately parallel to the mounting surface 70a, it may be possible to improve the reliability of the direction identification by performing observation from the direction parallel or approximately parallel to the mounting surface 70a at the same time.

While, in the above-mentioned example, the direction identification methods have been described that are performed when the laminated ceramic capacitor is mounted so that the internal electrodes thereof become parallel or approximately parallel to the mounting surface and when the laminated ceramic capacitor is mounted so that the internal electrodes thereof become vertical or approximately vertical to the mounting surface, it is also possible to identify a direction using the same method when, on one mounting target, a laminated ceramic capacitor mounted so as to become parallel or approximately parallel to the mounting surface thereof and a laminated ceramic capacitor mounted so as to become vertical or approximately vertical to the mounting surface thereof are mixed.

In addition, while how the wrap-around electrode portions A2 and B2 are viewed when being observed is different depending on which of the wrap-around electrode portions A2 and B2 is formed on the upper layer side, the external appearance configurations thereof are observed using a method conforming to the above-mentioned case, and hence, it is possible to perform the direction identification of the laminated ceramic electronic component 50.

In addition, in the above-mentioned preferred embodiments, as an example, the three-terminal type laminated ceramic capacitor has been cited and described as achieving advantageous effects of preferred embodiments of the present invention the most. However, in preferred embodiments of the present invention, the type of laminated ceramic electronic component is not limited to this, and preferred embodiments of the present invention may also be applied to various laminated ceramic electronic components including belt-shaped or substantially belt-shaped side surface outer electrodes.

For example, preferred embodiments of the present invention may also be applied to a laminated ceramic electronic component or the like, which includes an internal electrode extended to a side surface and no internal electrode extended to an end surface.

In addition, preferred embodiments of the present invention may also be applied to a laminated ceramic electronic component including a plurality of belt-shaped or substantially belt-shaped side surface outer electrodes.

In addition, also in another aspect, preferred embodiments of the present invention are not limited to the above-mentioned preferred embodiments, and as for the number of ceramic layers configuring a ceramic element body, the number of internal electrodes, dimensions, shapes, or the like, various applications or various modifications may be added within the scope of preferred embodiments of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A laminated ceramic electronic component comprising:
   a ceramic element body with a prism-shaped or substantially prism-shaped structure and including a plurality of laminated ceramic layers, first and second end surfaces facing each other, first and second side surfaces and third and fourth side surfaces, which connect the first and second end surfaces to each other and face each other, the end surfaces having square or substantially square shapes;
   a plurality of internal electrodes provided within the ceramic element body and extended to the first and second side surfaces; and
   a belt-shaped or substantially belt-shaped side surface outer electrode provided on the first to fourth side surfaces of the ceramic element body so as to circle around the ceramic element body and connected to the internal electrodes extended to the first and second side surfaces; wherein
   the side surface outer electrode circling around the ceramic element body includes a first electrode portion including a first side surface electrode portion provided on the first and second side surfaces of the ceramic element body and a first wrap-around electrode portion arranged to extend from the first side surface electrode portion and wrap around portions of the third and fourth side surfaces, and a second electrode portion including a second side surface electrode portion provided on the third and fourth side surfaces and a second wrap-around electrode portion arranged to extend from the second side surface electrode portion and wrap around portions of the first and second side surfaces; and
   external appearance configurations in which the first wrap-around electrode portion and the second wrap-around electrode portion are recognizable from outside are provided to the first wrap-around electrode portion and the second wrap-around electrode portion.

2. The laminated ceramic electronic component according to claim 1, wherein
   whether the first wrap-around electrode portion in the first electrode portion is arranged on an outer side portion of the second electrode portion or the second wrap-around electrode portion in the second electrode portion is arranged on an outer side portion of the first electrode portion is preliminarily set; and the first and second side surfaces of the ceramic element body, to which the internal electrodes are extended, are recognizable by observing, from the outside, which of the first and second wrap-around electrode portions is located on the outer side portion.

3. A manufacturing method for a serial taping electronic component including a carrier tape configured to include a plurality of cavities, and a laminated ceramic electronic component configured to be housed in each of the cavities, the manufacturing method comprising:

a process in which the laminated ceramic electronic component according to claim 2 is housed in one of the cavities;

identifying extraction directions of the internal electrodes by observing, from the outside, which of the first wrap-around electrode portion and the second wrap-around electrode portion is located in an outer side portion; and housing the laminated ceramic electronic component in the one of the cavities in a state where the extraction directions of the internal electrodes are aligned.

4. A direction identification method for a laminated ceramic electronic component, wherein the laminated ceramic electronic component is the laminated ceramic electronic component according to claim 2, the direction identification method comprising:

recognizing extraction directions of the internal electrodes and identifying a direction of the laminated ceramic electronic component, by observing, from the outside, which of the first wrap-around electrode portion and the second wrap-around electrode portion is located in an outer side portion.

5. The laminated ceramic electronic component according to claim 1, wherein the second wrap-around electrode portion of the second electrode portion is arranged on an outer side portion of the first electrode portion; and the first and second side surfaces, to which the internal electrodes are extended, are recognizable by recognizing a side surface, on which the second wrap-around electrode portion wraps around the outer side portion of the first electrode portion, by external observation.

6. The laminated ceramic electronic component according to claim 1, wherein the first wrap-around electrode portion of the first electrode portion is arranged on an outer side portion of the second electrode portion; and the first and second side surfaces, to which the internal electrodes are extended, are recognizable by recognizing a side surface around which the first wrap-around electrode portion wraps, by external observation.

7. The laminated ceramic electronic component according to claim 1, wherein a distance of the first wrap-around electrode portion of the first electrode portion, which extends from the first side surface or the second side surface of the ceramic element body to a leading end thereof, is larger than a distance of the second wrap-around electrode portion of the second electrode portion, which extends from the third side surface or the fourth side surface of the ceramic element body to a leading end thereof; and by observing the wrap-around electrode portion from the outside and recognizing that a wrap-around electrode portion where a distance from a side surface of the ceramic element body to a leading end is larger is the first wrap-around electrode portion of the first electrode portion, the first and second side surfaces, to which the internal electrodes are extended, are recognizable from a surface on which the first wrap-around electrode portion is located.

8. The laminated ceramic electronic component according to claim 1, wherein a distance of the second wrap-around electrode portion of the second electrode portion, which extends from the third side surface or the fourth side surface of the ceramic element body to a leading end thereof, is larger than a distance of the first wrap-around electrode portion in the first electrode portion, which extends from the first side surface or the second side surface of the ceramic element body to a leading end thereof; and by observing the wrap-around electrode portion from the outside and recognizing that a wrap-around electrode portion where a distance from a side surface of the ceramic element body to a leading end is larger is the second wrap-around electrode portion of the second electrode portion, the first and second side surfaces, to which the internal electrodes are extended, are recognizable from a surface in which the second wrap-around electrode portion is located.

9. A manufacturing method for a laminated ceramic electronic component including a ceramic element body with a prism-shaped or substantially prism-shaped structure and including a plurality of laminated ceramic layers, first and second end surfaces facing each other, first and second side surfaces and third and fourth side surfaces, which connect the first and second end surfaces to each other and face each other, the end surfaces having square or substantially square shapes, a plurality of internal electrodes provided within the ceramic element body and extended to the first and second side surfaces, and a belt-shaped or substantially belt-shaped side surface outer electrode arranged on the first to fourth side surfaces of the ceramic element body so as to circle around the ceramic element body and connected to the internal electrodes extended to the first and second side surfaces; wherein a process for forming the side surface outer electrode includes:

a first application process in which a conductive paste is applied to the first and second side surfaces so that the conductive paste extends from the first and second side surfaces and wraps around the third and fourth side surfaces and a first wrap-around electrode portion for the third and fourth side surfaces is formed; and a second application process in which a conductive paste is applied to the third and fourth side surfaces so that the conductive paste extends from the third and fourth side surfaces and wraps around the first and second side surfaces and a second wrap-around electrode portion for the first and second side surfaces is formed; wherein external appearance configurations where the first wrap-around electrode portion and the second wrap-around electrode portion are recognizable by external observation are provided to the first wrap-around electrode portion and the second wrap-around electrode portion.

10. The manufacturing method for a laminated ceramic electronic component according to claim 9, wherein which of the first application process and the second application process is implemented first is preliminarily set and the first application process and the second application process are implemented in a set sequence.

11. The manufacturing method for a laminated ceramic electronic component according to claim 9, wherein the second application process is implemented after the first application process has been implemented.

12. The manufacturing method for a laminated ceramic electronic component according to claim 9, wherein the first application process is implemented after the second application process has been implemented.

13. A serial taping electronic component comprising:
    a carrier tape including a plurality of cavities; and
    a laminated ceramic electronic component configured to be housed in each of the cavities; wherein
    the laminated ceramic electronic component is the laminated ceramic electronic component according to claim 1.

14. The serial taping electronic component according to claim 13, wherein the laminated ceramic electronic component is housed in one of the cavities in a state where extraction directions of the internal electrodes are aligned.

15. The serial taping electronic component according to claim 13, wherein
    in a form in which the first wrap-around electrode portion of the first electrode portion is located on an outer side portion of the second electrode portion and the first wrap-around electrode portion faces an aperture portion of the cavity; or
    in a form in which the second wrap-around electrode portion of the second electrode portion is located on an outer side portion of the first electrode portion and the second wrap-around electrode portion faces an aperture portion of the cavity;
    the laminated ceramic electronic component is housed in one of the cavities.

16. The serial taping electronic component according to claim 13, wherein the first wrap-around electrode portion faces an aperture portion of the cavity, and the laminated ceramic electronic component is housed in one of the cavities in such a posture that main surfaces of the internal electrodes are parallel or approximately parallel to a bottom surface of the cavity.

17. The serial taping electronic component according to claim 13, wherein the second wrap-around electrode portion faces an aperture portion of the cavity, and the laminated ceramic electronic component is housed in one of the cavities in such a posture that main surfaces of the internal electrodes are parallel or approximately parallel to a bottom surface of the cavity.

18. A manufacturing method for a serial taping electronic component including a carrier tape configured to include a plurality of cavities, and a laminated ceramic electronic component configured to be housed in each of the cavities, the manufacturing method comprising:
    a process in which the laminated ceramic electronic component according to claim 1 is housed in one of the cavities.

19. The manufacturing method for a serial taping electronic component according to claim 18, further comprising:
    identifying extraction directions of the internal electrodes by observing external appearance configurations of the first wrap-around electrode portion and the second wrap-around electrode portion; and
    housing the laminated ceramic electronic component in one of the cavities in a state where the extraction directions of the internal electrodes are aligned.

20. The manufacturing method for a serial taping electronic component according to claim 19, further comprising:
    a process in which the laminated ceramic electronic component is housed in one of the cavities in such a posture that main surfaces of the internal electrodes are parallel or approximately parallel to a bottom surface of the cavity.

21. The manufacturing method for a serial taping electronic component according to claim 19, further comprising:
    a process in which the laminated ceramic electronic component is housed in one of the cavities in such a posture that main surfaces of the internal electrodes are vertical or approximately vertical to a bottom surface of the cavity.

22. A direction identification method for a laminated ceramic electronic component, used for identifying a direction of the laminated ceramic electronic component according to claim 1 and mounted on a mounting target, the direction identification method comprising:
    recognizing extraction directions of the internal electrodes and identifying a direction of the laminated ceramic electronic component, by observing an external appearance configuration of at least one of the first wrap-around electrode portion and the second wrap-around electrode portion after the laminated ceramic electronic component has been mounted.

23. The direction identification method for a laminated ceramic electronic component according to claim 22, the direction identification method further comprising:
    observing the external appearance configuration of a top surface of the laminated ceramic electronic component, from above a mounting surface, in a state of being mounted in the mounting target.

24. The direction identification method for a laminated ceramic electronic component according to claim 23, the direction identification method further comprising:
    observing the external appearance configuration of a side surface of the laminated ceramic electronic component.

* * * * *